(12) United States Patent
Risser et al.

(10) Patent No.: US 12,656,426 B2
(45) Date of Patent: Jun. 16, 2026

(54) QUANTUM MAGNETIC SENSING TECHNOLOGIES, SYSTEMS AND METHODS USING THE SAME

(71) Applicant: Battelle Memorial Institute, Columbus, OH (US)

(72) Inventors: Steven M. Risser, Reynoldsburg, OH (US); Andy F. Kirby, Oak Hill, VA (US); Richard J. Higgins, Lewis Center, OH (US); Anthony F. George, Columbus, OH (US)

(73) Assignee: Battelle Memorial Institute, Columbus, OH (US)

( * ) Notice: Subject to any disclaimer, the term of this patent is extended or adjusted under 35 U.S.C. 154(b) by 75 days.

(21) Appl. No.: 18/408,846

(22) Filed: Jan. 10, 2024

(65) Prior Publication Data

US 2024/0288519 A1    Aug. 29, 2024

Related U.S. Application Data

(60) Provisional application No. 63/487,363, filed on Feb. 28, 2023.

(51) Int. Cl.
*G01V 3/00* (2006.01)
*G01R 33/032* (2006.01)
(Continued)

(52) U.S. Cl.
CPC ......... *G01R 33/323* (2013.01); *G01R 33/032* (2013.01); *G01R 33/26* (2013.01); *G02B 6/02347* (2013.01); *G02B 6/262* (2013.01)

(58) Field of Classification Search
CPC .... G01R 33/323; G01R 33/032; G01R 33/26; G02B 6/02347; G02B 6/262
(Continued)

(56) References Cited

U.S. PATENT DOCUMENTS 10,725,124 B2 *  7/2020  Boesch ................ G01R 33/032
11,131,724 B2 *  9/2021  Garber ................ A61B 5/7203
(Continued)

FOREIGN PATENT DOCUMENTS

CN    103259167 A  *  8/2013
CN    105403322 A  *  3/2016  ........... G01K 11/006
(Continued)

OTHER PUBLICATIONS

KR 2021075402 A (Hwang) (Year: 2021).*
(Continued)

*Primary Examiner* — Walter L Lindsay, Jr.
*Assistant Examiner* — Frederick Wenderoth
(74) *Attorney, Agent, or Firm* — Secant IP, PLLC; Donald G. Weiss

(57) ABSTRACT

In an approach to measuring a magnetic field of a sample, a system includes an optical fiber comprising a first end and a second end, the optical fiber having a core; and a nitrogen vacancy (NV) diamond sensor; where the first end of the optical fiber is configured to receive excitation light from an optical excitation source; and the NV diamond sensor is coupled to the second end of the optical fiber with an optical matching material, the optical matching material configured to optically match the NV diamond sensor to the core of the optical fiber.

17 Claims, 14 Drawing Sheets

(51) Int. Cl.

| | |
|---|---|
| *G01R 33/26* | (2006.01) |
| *G01R 33/32* | (2006.01) |
| *G02B 6/02* | (2006.01) |
| *G02B 6/26* | (2006.01) |

(58) Field of Classification Search
USPC .......................................................... 324/304
See application file for complete search history.

(56) References Cited

U.S. PATENT DOCUMENTS

| 2016/0161761 | A1* | 6/2016 | Quere | .............. | B29D 11/00009 |
|---|---|---|---|---|---|
| 2021/0373242 | A1* | 12/2021 | Lee | ....................... | G02B 6/1226 |

FOREIGN PATENT DOCUMENTS

| CN | 110045273 | A | * | 7/2019 | ......... | G01R 31/3275 |
|---|---|---|---|---|---|---|
| CN | 107144392 | B | * | 10/2019 | .............. | G01L 9/16 |
| CN | 101630028 | A | * | 1/2020 | | |
| CN | 111344551 | A | * | 6/2020 | ........... | G01J 3/0237 |
| CN | 214852459 | U | * | 11/2021 | | |
| CN | 113777540 | A | * | 12/2021 | ......... | G01R 33/0011 |

OTHER PUBLICATIONS

Barry, et al., "Sensitivity Optimization for NV-Diamond Magnetometry", Quantum Physics, May 28, 2020, Version 2, pp. 1-73, Retrieved from https://arxiv.org/abs/1903.08176.

Dréau, et al., "Avoiding Power Broadening in Optically Detected Magnetic Resonance of Single NV Defects for Enhanced DC-magnetic Field Sensitivity", Condensed Matter > Mesoscale and Nanoscale Physics, Feb. 21, 2012, Version 2, pp. 1-9, Retrieved from https://arxiv.org/abs/1108.0178.

Kitching, "Chip-scale Atomic Devices", Applied Physics Reviews 5, 031302, Aug. 14, 2018, AIP Publishing, Boulder, CO, 39 pages.

Levine, et al., "Principles and Techniques of the Quantum Diamond Microscope", Nanophotonics 2019; 8(11), De Gruyter, Cambridge, MA, pp. 1945-1973.

Storteboom, et al., "Lifetime Investigation of Single Nitrogen Vacancy Centres in Nanodiamonds", Optics Express, vol. 23, No. 9, May 4, 2015, Victoria, Australia, pp. 11327-11333.

Subedi, et al., "Laser Spectroscopic Characterization of Negatively Charged Nitrogen-vacancy (NV-) Centers in Diamond", Optical Materials Express, vol. 9, No. 5, May 1, 2019, Birmingham, AL, pp. 2076-2087.

\* cited by examiner

200

| | Population of Ms=0 | Population of Ms=+1 | Population of Ms=-1 |
|---|---|---|---|
| RF=0 | 0.8 | 0.1 | 0.1 |
| RF≠0 | 0.6 | 0.2 | 0.2 |

|  | Total Emission |
|---|---|
| RF=0 | 0.86 |
| RF≠0 | 0.72 |
|  |  |
| Maximum Contrast | 0.84 |

Frequency is swept and light intensity measured

300

300'

|  | Population of Ms=0 | Population of Ms=+1 | Population of Ms=-1 |
|---|---|---|---|
| RF=0 | 0.8 | 0.1 | 0.1 |
| RF≠0 | 0.6 | 0.2 | 0.2 |

FIG. 7A

|  | Emission from Ms=0 (I1) | Emission from Ms=±1 (I2) | Total Emission (I1 + I2) |
|---|---|---|---|
| RF=0 | 0.8 | 0.06 | 0.86 |
| RF≠0 | 0.6 | 0.12 | 0.72 |
|  |  |  |  |
| Maximum Contrast | 0.75 | 2.00 | 0.84 |

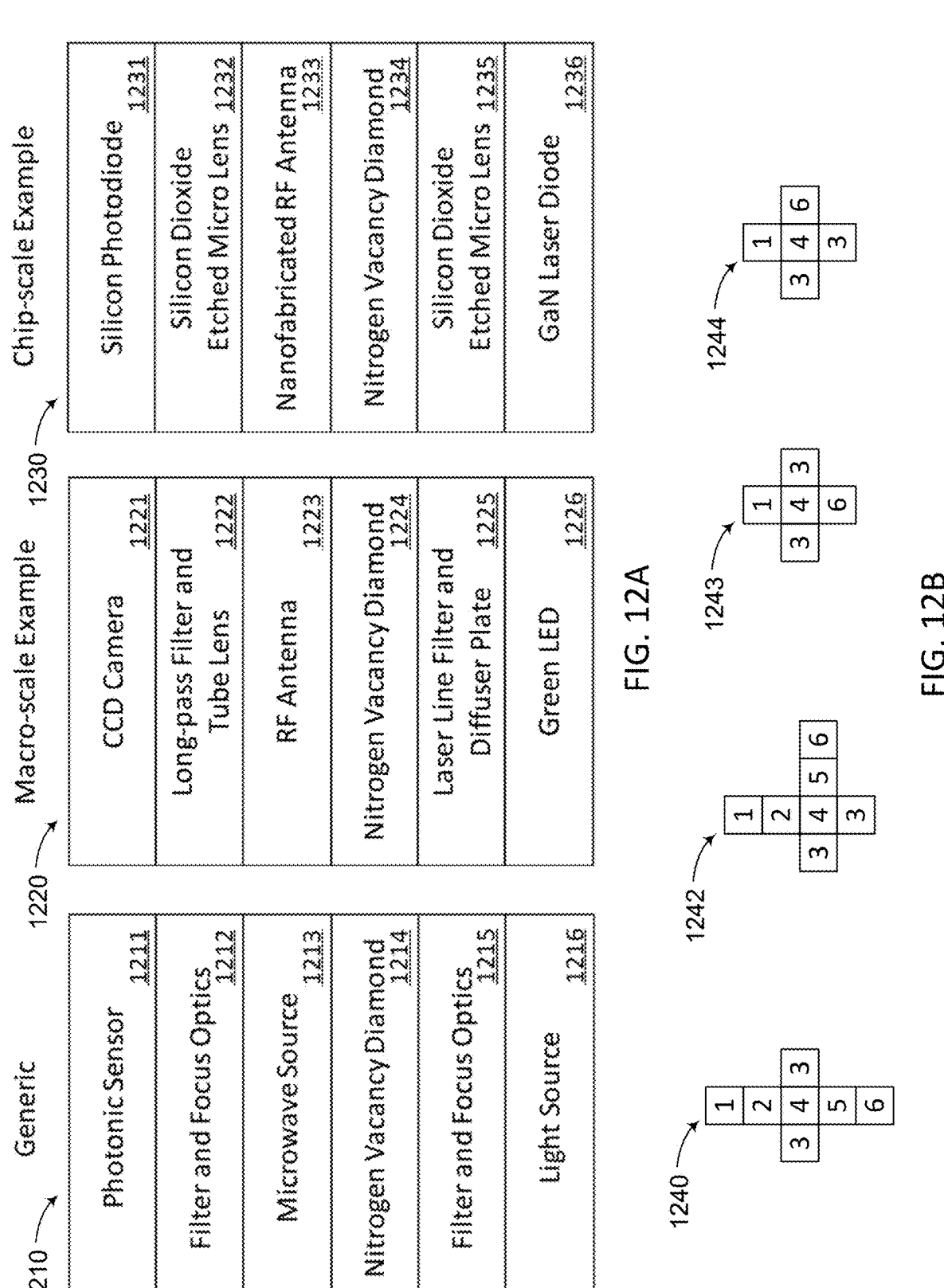

Generic 1210

| Photonic Sensor 1211 |
| Filter and Focus Optics 1212 |
| Microwave Source 1213 |
| Nitrogen Vacancy Diamond 1214 |
| Filter and Focus Optics 1215 |
| Light Source 1216 |

Macro-scale Example 1220

| CCD Camera 1221 |
| Long-pass Filter and Tube Lens 1222 |
| RF Antenna 1223 |
| Nitrogen Vacancy Diamond 1224 |
| Laser Line Filter and Diffuser Plate 1225 |
| Green LED 1226 |

Chip-scale Example 1230

| Silicon Photodiode 1231 |
| Silicon Dioxide Etched Micro Lens 1232 |
| Nanofabricated RF Antenna 1233 |
| Nitrogen Vacancy Diamond 1234 |
| Silicon Dioxide Etched Micro Lens 1235 |
| GaN Laser Diode 1236 |

QUANTUM MAGNETIC SENSING TECHNOLOGIES, SYSTEMS AND METHODS USING THE SAME

CROSS-REFERENCE TO RELATED APPLICATIONS

The present application claims the benefit of the filing date of U.S. Provisional Application Ser. No. 63/487,363, filed Feb. 28, 2023, the entire teachings of which application is hereby incorporated herein by reference.

TECHNICAL FIELD

The present disclosure relates to quantum magnetic sensing technologies, systems and methods using the same. In particular, the present disclosure relates to quantum magnetic sensing technologies utilizing nitrogen vacancy diamond, and systems and methods using the same.

BACKGROUND

The nitrogen vacancy (NV) defect in diamond includes a nitrogen atom at a site in the diamond lattice that is next to a carbon vacancy, resulting in a NV center with $C_3V$ symmetry. The NV center may have four orientations, each corresponding to one of the different crystallographic orientations of the diamond lattice. The NV center can exist in a neutral charge state (referred to as $NV^0$ or NV0) or a negative charge state (referred to herein as NV−).

Systems that utilize NV diamond sensors to measure various characteristics of a sample have been developed. For example, systems that utilize NV diamond centers to measure the magnetic field of a sample based on changes in the fluorescence produced by the NV diamond center are known. While such systems are useful, there remains a desire in the art to improve the capabilities of such systems, particularly their sensitivity. The present disclosure is aimed at such needs.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 7A is a table of populations for one example calculation of total emissions consistent with the present disclosure.

FIG. 7B is a table of the resulting total emissions consistent with the present disclosure.

FIG. 12A is a table of subcomponents that may be used in the design of a compact magnetometer using an NV diamond, along with two examples of devices to reduce the size of the magnetometer consistent with the present disclosure.

FIG. 12B is an example of configurations of the compact magnetometer of FIG. 12A to further minimize device volume and overcome geometric design restrictions consistent with the present disclosure.

Although the following Detailed Description will proceed with reference being made to illustrative embodiments, many alternatives, modifications, and variations thereof will be apparent to those skilled in the art.

DETAILED DESCRIPTION

Figure 1:
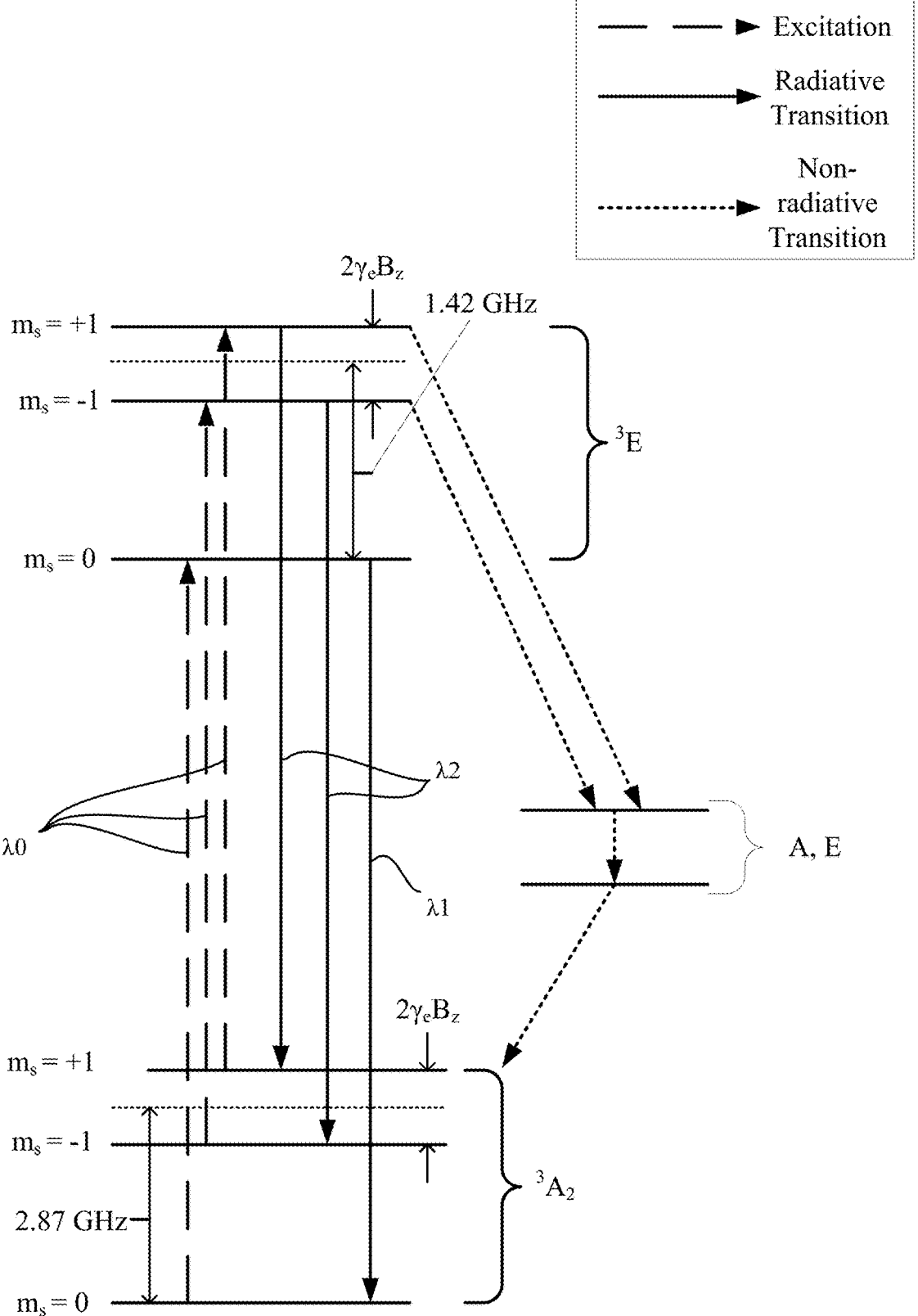
FIG. 1 is an energy level diagram showing energy levels and spin states of an NV diamond center.

The NV center of nitrogen vacancy diamond has rotational symmetry with a ground state and an excited state. The ground state is a spin triplet with $^3A_2$ symmetry, and includes one spin state $m_s=0$ and two additional spin states $m_s=-1$ and $m_s=1$. In the absence of an external magnetic field the $m_s=-1$ and $m_s=1$ states have the same energy, i.e., are degenerate, but are offset from one another due to spin-spin interactions. As shown in FIG. 1, the $m_s=+/-1$ spin states are split from the $m_s=0$ by an energy of 2.87 Gigahertz (GHz) in the absence of an external magnetic field. Introducing an external magnetic field with a component along the NV axis causes the excited $m_s=+/-1$ states to split by an amount equal to $2 \gamma_e B_z$, where $\gamma_e$ is the gyromagnetic ratio (28 GHz/T), and $B_z$ is the component of the external magnetic field along the NV axis.

As further shown in FIG. 1, the NV center also has an excited triplet state $^3E$ with corresponding $m_s=0$, $m_s=1$, and $m_s=-1$ states. Optical transitions between the excited and ground states are typically spin conserving, i.e., they occur between excited and ground states of the same spin. Radiative and non-radiative pathways exist to transition electrons between the excited $^3E$ state and the ground $^3A_2$ state. Electrons in the excited spin states can decay radiatively and in a spin conserving manner from the $^3E$ excited state to the ground $^3A_2$ state, resulting in the production of a photon of red light ($\lambda1$, $\lambda2$) with a photon energy corresponding to the difference in the excited and ground states. Electrons in the $^3E$ excited state can also decay non-radiatively—particularly from the excited $m_s=+/-1$ states—via one or more intermediate electron states A, E, e.g., singlet states with an energy level between the $^3E$ and $^3A_2$ states as shown in FIG. 1.

The transition rate from the excited $m_s=+/-1$ spin states to the intermediate energy levels A, E is greater than the transition rate from the excited $m_s=0$ spin state to the intermediate energy levels A, E. Moreover, the decay transition from the A, E intermediate state is predominantly to the $m_s=0$ state of the ground $^3A_2$ state. Consequently, optical excitation of the NV center with green light ($\lambda0$) can excite electrons from the ground $^3A_2$ state to the $^3E$ state, and the resulting decay will eventually pump the NV center into the $m_s=0$ state of the ground $^3A_2$ state. The $m_s=0$ state of the ground state can thus be set to a maximum or other desired polarization based on the decay rates from the $^3E$ excited state to the intermediate A, E states.

The intensity of the fluorescence produced from optically stimulating the $^3E$ excited states is less for the excited $m_s=+/-1$ states than it is for the excited $m_s=0$ state, because the excited $m_s=+/-1$ states predominantly decay by the non-radiative pathway through the intermediate A, E states. As a result, the spin state of the NV diamond can be determined based on its measured fluorescence intensity, because the fluorescence intensity produced by the NV diamond will decrease as the population of the excited $m_s=+/-1$ states increase relative to the population of the excited $m_s=0$ state.

Figures 2A, 2B:
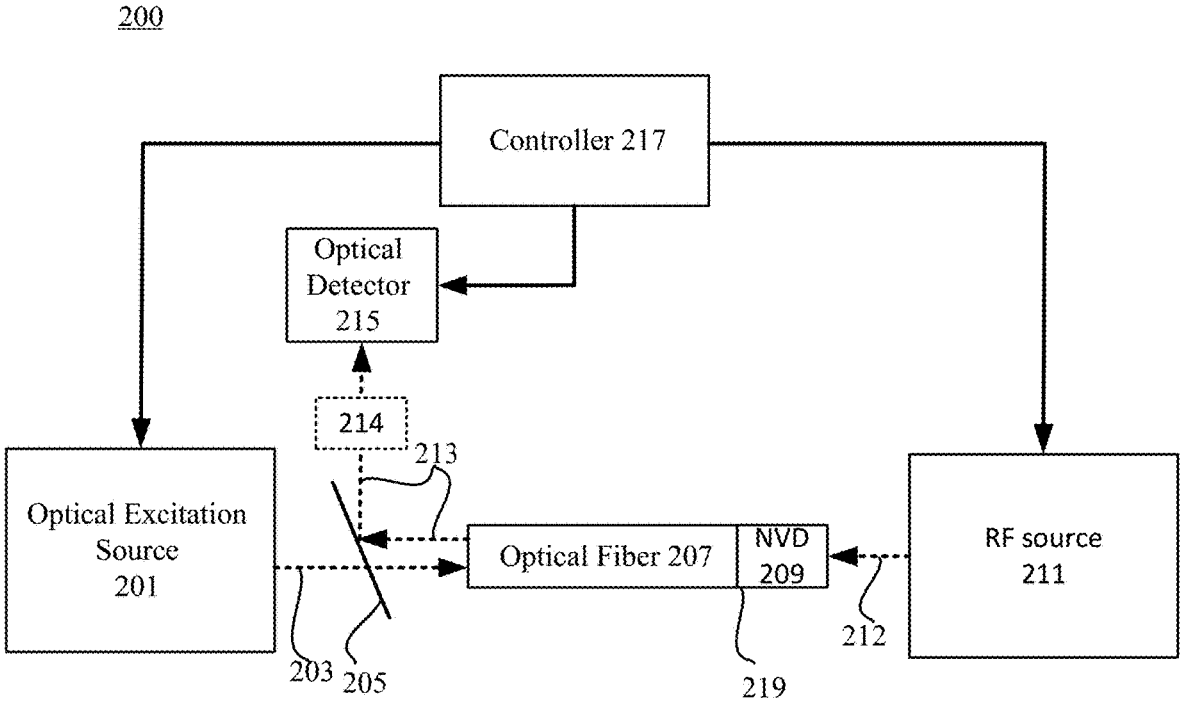
FIG. 2A is a block diagram of one example of an NV diamond magnetic sensor system.
FIG. 2B is a table of populations for one example calculation of total emissions consistent with the present disclosure.

Systems for measuring magnetic fields with NV diamond sensors have been developed. FIG. 2A is a schematic diagram of one example of a NV diamond magnetic system. System 200 includes an optical excitation source 201 that is optically coupled to one end of an optical fiber 207 via a dichroic mirror 205. The other end of optical fiber 207 is optically coupled to an NV diamond sensor 209. System 200 further includes a radio frequency (RF) source 211, an optical detector 215, and a controller 217. System 200 may optionally include one or more optical filters 214 in the optical path upstream of optical detector 215, such as between optical detector 215 and dichroic mirror 205.

Optical excitation source 201 is configured to emit excitation light 203, for conveyance through dichroic mirror 205 and optical fiber 207 to NV diamond sensor 209—which includes one or more NV diamond centers as described previously. Signal light 213 (e.g., fluorescence) from the NV diamond sensor is conveyed back through optical fiber 207 and is redirected by dichroic mirror 205 to optical detector 215 and optionally through one or more optical filters 214.

Optical excitation source 201 may be any suitable light emitting device that can emit excitation light 203, such as a laser or light emitting diode. The excitation light 203 may be light of any suitable wavelength, such as green light in the visible portion of the electromagnetic spectrum. In general, excitation light 203 from optical excitation source 201 excites electrons from the ground $m_s=0$ to the excited $m_s=0$ states and from the ground $m_s=+/-1$ states to the excited $m_s=+/-1$ states. Without limitation, optical excitation source is preferably a laser that emits light with a wavelength $\lambda0$ in the green region of the electromagnetic spectrum, such as a Nd:YAG laser that can emit, for example, green light with $\lambda0=515$ or 532 nanometers (nm). The transition of electrons from the $^3E$ excited state to the $^3A_2$ ground state (particularly from the excited $m_s=0$ to the ground $m_s=0$ states) results in the production of signal light 213 (e.g., fluorescence) as discussed above. In embodiments the signal light 213 is or includes red light. As discussed later, the wavelength of the red light emitted by decay from the $m_s=0$ excited state to the ground state may differ from the wavelength of the light emitted by decay from the $m_s=+/1$ excited states to the corresponding ground states. For example, signal light 213 may include red light from the $m_s=0$ transition that has a wavelength $\lambda1$, and red light from the $m_s=+/-$ transition that has a wavelength $\lambda2$, wherein $\lambda1$ does not equal $\lambda2$. For example, in embodiments $\lambda2$ may differ from $\lambda1$ by $\geq$about $+/-0.010$ nm, such as $\geq+/-0.005$ nm, or even $\geq+/-0.002$ nm. Without limitation, $\lambda2$ differs from $\lambda1$ by about $+/-0.002$ nm. In addition to inducing fluorescence by NV diamond sensor 209, excitation light 203 may also serve to adjust the population of the $m_s=0$ spin state of the ground $^3A_2$ state, e.g., to a maximum or other desired polarization.

Dichroic mirror 205 is configured to selectively transmit excitation light 203 (e.g., green light) produced by optical excitation source, and to reflect signal light 213 (e.g., red light produced by NV diamond sensor 209) towards optical detector. Prior to conveyance to optical detector 215, signal light 213 may optionally pass through optional optical filter 214, e.g., to filter out excitation light 203 that may be present in the signal light 213. Alternate devices to transmit one of the excitation light 203 while passing signal light 213 include beam-splitters, Bragg filters, or any other optical device that controls direction of propagation based on the wavelength.

Optical fiber 207 may be any suitable optical fiber for transmitting excitation light 203 and signal light 213. For example, and as discussed later in connection with FIG. 4A, optical fiber 207 may be in the form of or include a jacket, a cladding, and a core, wherein the cladding is configured to contain excitation light 203 and signal light 213 within the optical fiber 207 via total internal reflection at the boundary between the core and the cladding. Single and multiple clad optical fibers may also be used. In embodiments and as discussed later in connection with FIGS. 5, and 6, optical fiber 207 may include a waveguide or other RF transmitting structure that can convey RF energy (e.g., an RF signal) from RF source to NV diamond (NVD) sensor 209.

NV diamond sensor 209 may be configured with NV centers that are aligned along one or more of the four different orientations of the diamond lattice. When the NV diamond sensor 209 includes NV centers that are aligned along a single orientation, the component of an external magnetic field along that orientation may be sensed by the sensor. Similarly, when the NV diamond sensor 209 includes NV centers oriented along multiple orientations, the components of the external magnetic field along each of those orientations may be sensed by NV diamond sensor 209. Consequently, NV diamond sensor 209 can allow the detection of the magnitude of an external magnetic field and its direction. NV diamond sensor 209 may be coupled to optical fiber 207 in any suitable manner. As discussed later in conjunction with FIGS. 3A-6, in embodiments the NV diamond sensor 209 is coupled to one end of optical fiber 207 with an optically matching material 301, such as an adhesive or other material that optically matches optical fiber 207 with NV diamond sensor 209.

RF source 211 may be any suitable source of RF energy 212, such as but not limited to a microwave coil. In any case, RF source 211 may be configured to emit RF energy 212 with an energy that causes a transition between the ground $m_s=0$ spin state and the ground $m_s=+/-1$ spin states. For example, application of the RF field may reduce the overall population of the ground $m_s=0$ state and increase the population of the $m_s=+/-1$ states, with corresponding decreases and increases in the excited $m_s=0$ and $m_s=+/-1$ states' following application of the excitation light 203. As a result, application of RF energy 212 may cause a decrease in the intensity of the signal light 213 due to the reduced population in the excited $m_s=0$ state and the tendency of the excited $m_s=+/-1$ states to decay non-radiatively through the intermediate energy states A, E. In the absence of an external magnetic field, the maximum decrease in signal is measured when the frequency of the applied RF field is 2.87 GHZ.

The above concept can be explained with a relatively simple model. In the absence of a microwave (RF) field, it may be assumed that all (100%) electrons excited from the $m_s=0$ ground state to the $m_s=0$ excited state will return to the $m_s=0$ ground state via emission of a photon with a wavelength $\lambda 1$. In contrast, it may be assumed that 30% of electrons excited from the ground $m_s=+/-1$ states to the exited $m_s=+/-1$ states will return to the $m_s=$ground state by emission of a photon with a wavelength $\lambda 2$. If the population (N0) of the ground $m_s=0$ state is assumed to be 0.8, the population (N1) of the ground $m_s=1$ state is assumed to be 0.1, and the population (N−1) of the ground $m_s=-1$ state is assumed to be 0.1, the number of emitted photons (Ne) per absorbed photon can be calculated using formula 1:

$$Ne = (N0 * 1.0) + (N1 * 0.3) + (N2 * 0.3) \tag{1}$$

Thus, when N0=0.8, N1=0.1, and N−1=0.1, Ne is 0.86.

Figures 2C, 2D:
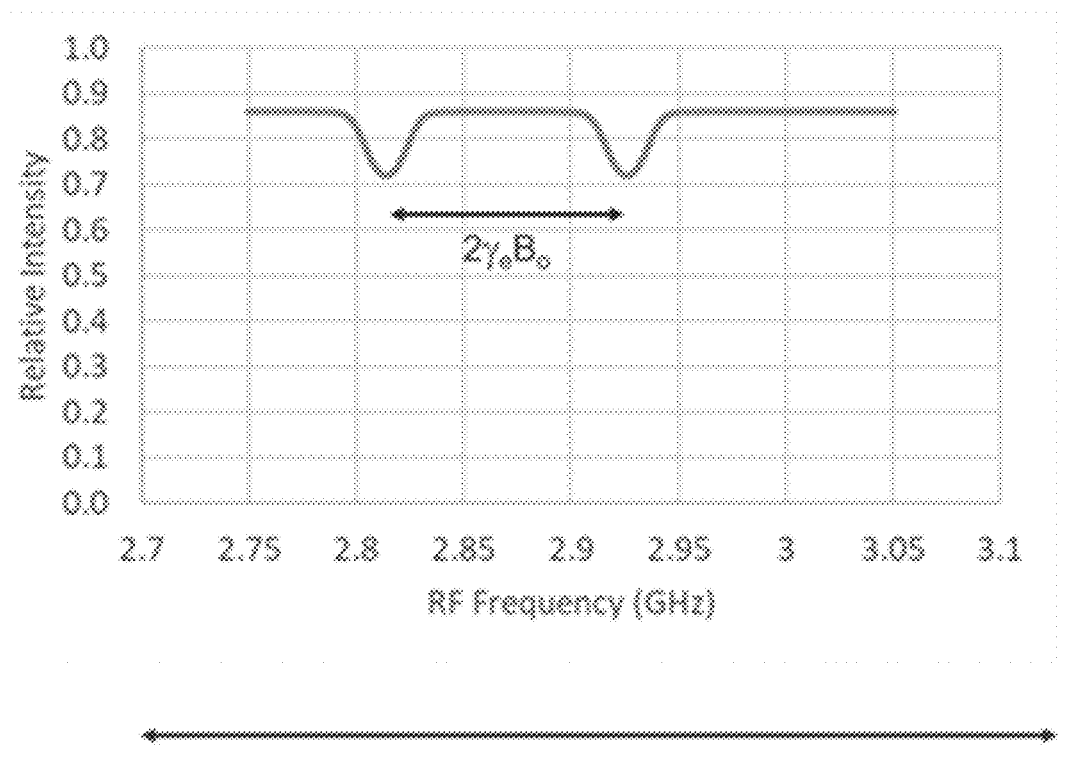
FIG. 2C is a table of the resulting total emissions consistent with the present disclosure.
FIG. 2D is a typical output from the measurement of magnetic field in FIG. 2A consistent with the present disclosure.

Application of an RF (microwave) field to the NV diamond can changes the populations of the $m_s=0$ and $m_s=+/-1$ ground states. For example, application of a 2.87 GHz RF field to the NV diamond may result in N0=0.6, N1=0.2, and N−1=0.2. Applying formula 1 above, Ne is 0.72. Thus, application of the RF (microwave field) in this model results in a reduction in the number of emitted photons from 0.86 to 0.72, i.e., a 16% reduction in signal light. These two intensities can then be used to define the contrast, which is the ratio of the signal without the RF field to the signal with the RF field. In this case, the contrast is 0.84. This value is important to define the length of time a measurement must be performed to obtain a statically significant measurement. The populations with and without the application of the RF field for the above example are summarized in FIG. 2B. The resulting total emissions for this example are summarized in FIG. 2C. FIG. 2D is a typical output from this type of measurement of magnetic field.

Figure 8:
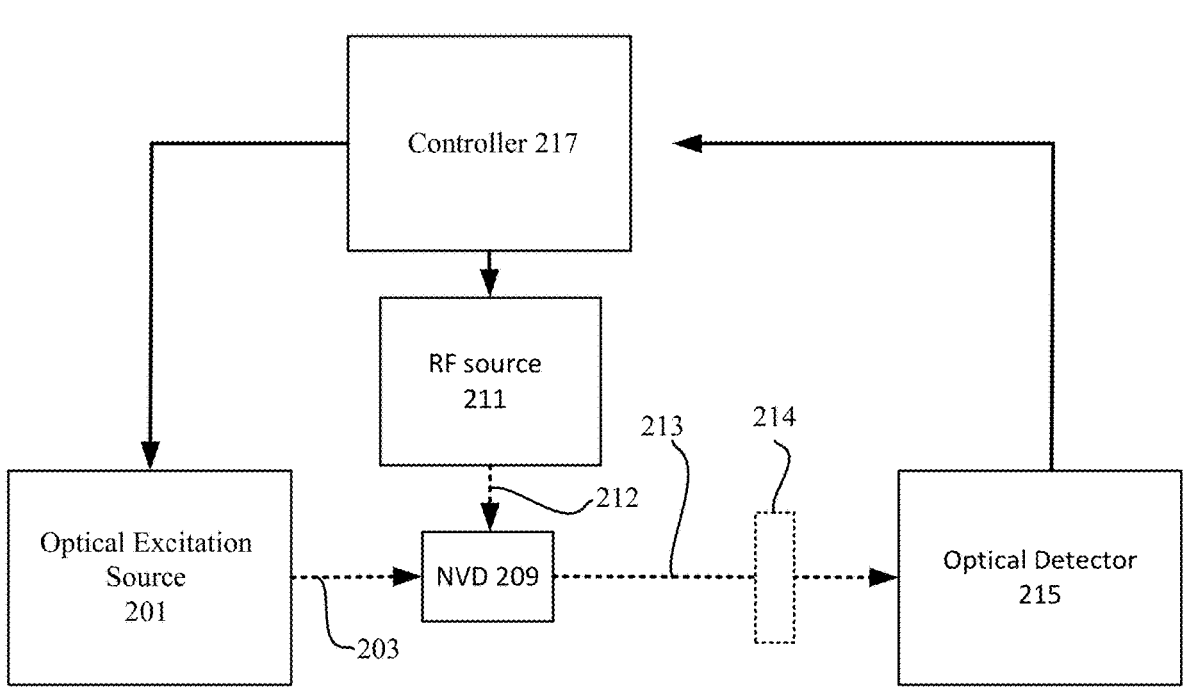
FIG. 8 is a block diagram of another example of a NV diamond sensor system consistent with the present disclosure.

Optical detector 215 is generally configured to measure one or more components of signal light 213 to facilitate determination of the one or more components of a magnetic field produced by a sample under consideration. In embodiments, optical detector 215 is in the form of or includes a spectrometer that is configured to measure the intensity and wavelength of signal light 213, e.g., resulting from the transitions between various states of NV diamond sensor 209. As discussed later in connection with FIG. 8, in embodiments the optical detector 215 is a high resolution spectrometer that is capable of detecting and distinguishing signal light produced by the transition between the excited $m_s=0$ and $m_s=+/-1$ states to their corresponding ground states.

Controller 217 is generally configured to control operation of the other components of system 200. In that regard, controller 217 may include a processor, memory, and computer readable instructions that when executed cause controller 217 to perform measurement operations consistent with the present disclosure. For example, the computer readable instructions when executed may cause controller to cause optical excitation source 201 and RF source 211 to stimulate NV diamond sensor 209 and cause optical detector to measure signal light 213 resulting from such stimulation. In embodiments and as described above, the computer readable instructions may cause controller to determine one or more components of an external magnetic field based only on emitted photons attributable to decay from $m_s=+/-1$ excited states to the corresponding ground states. Further details concerning controller 217 are provided below in connection with FIG. 10.

System 200 may be used to measure the intensity of an external magnetic field, e.g., of a sample in proximity to NV diamond sensor 209. During such measurement NV diamond sensor 209 may be placed in proximity to the sample and system 200 may be operated in a measurement mode, such as a continuous wave mode. In the continuous wave mode optical excitation source 201 may continuously emit excitation light 203 to stimulate the NV centers in the NV diamond sensor 209 while RF source 211 is swept in a frequency range that includes 2.87 GHZ (the energy at which the ground $m_s=+/-1$ are degenerate in the absence of an external magnetic field).

The excitation light excites a transition from the ground $m_s=0$ and $m_s=+/-1$ states to their corresponding excited states. As the electrons in the excited states relax, red photons are emitted by NV diamond sensor 209 and measured by optical detector 215. Referring back to FIG. 1, in the presence of an external magnetic field, the degeneracy of the $m_s=+/-1$ states is removed, and now there are two separate frequencies at which the intensity of emitted light is reduced. The energy splitting between such states is equal to 2 $\gamma_e B_z$, where $B_z$ is the component of the external magnetic field along the NV axis. As a result, the component $B_z$ of the magnetic field produced by the sample can be determined based on the measured fluorescence. See FIG. 2D for typical output from this type of measurement of magnetic field.

The system of FIG. 2A can thus enable localized measurement of magnetic fields by placing NV diamond sensor 209 in proximity to a sample to be measured. For example, the system of FIG. 2A may be used to measure magnetic fields in-situ, e.g., within a sample or even within a human body, simply by repositioning the end of optical fiber 207 bearing NV diamond sensor 209 in proximity to the sample to be measured. System 200 may also be used to measure magnetic fields in a liquid sample by submerging NV diamond sensor 209 below the surface of that sample.

While the system of FIG. 2A is useful, direct coupling of NV diamond sensor 209 to an end of optical fiber 207 results in the formation of an interface 219 between the NV diamond sensor 209 and optical fiber 207. With that in mind, NV diamond sensor 209 and optical fiber 207 (and particularly its core) may be optically mismatched at interface 219. As used herein, the term "optically mismatched" means that the optical indices of two adjacent materials (i.e., n1, n2, respectively) in an optical path differ by more the 5% at an indicated wavelength or wavelength range, less than or equal to 2.5% or even less than or equal to 1%.

More specifically, the optical index of the core many optical fibers (i.e., Ncore) differs from the optical index (Nd) of nitrogen vacancy diamond at the wavelength(s) of the (e.g., green) excitation light 203 and/or the (e.g., red) signal light 213 by more than 5%. For example, the optical index Nd of NV diamond in the visible region of the electromagnetic spectrum is about 2.4. In contrast, the optical index (N of the optical fiber (or, more specifically, the optical index (Ncore) of the core of the optical fiber may differ from the optical index Nd by 5% or more and fall within the range of about 1.45 for glass to 1.49 for PMMA to 1.59 for polystyrene. As a result, NV diamond sensor 209 and optical fiber 207 may be optically mismatched at interface 219. That optical mismatch can limit or otherwise impair the operation of system 200 in several ways. For example, optical mismatching at interface 219 may cause a portion of excitation light 203 to be reflected or scattered away from NV diamond sensor-reducing the efficiency with which transitions from the ground $^3A_2$ state to the $^3E$ state are induced. Similarly, the optical mismatch can result in reflection and/or scattering of signal light 213 at interface 219—reducing the amount of signal light 213 that is conveyed to optical detector 215.

Figure 3A:
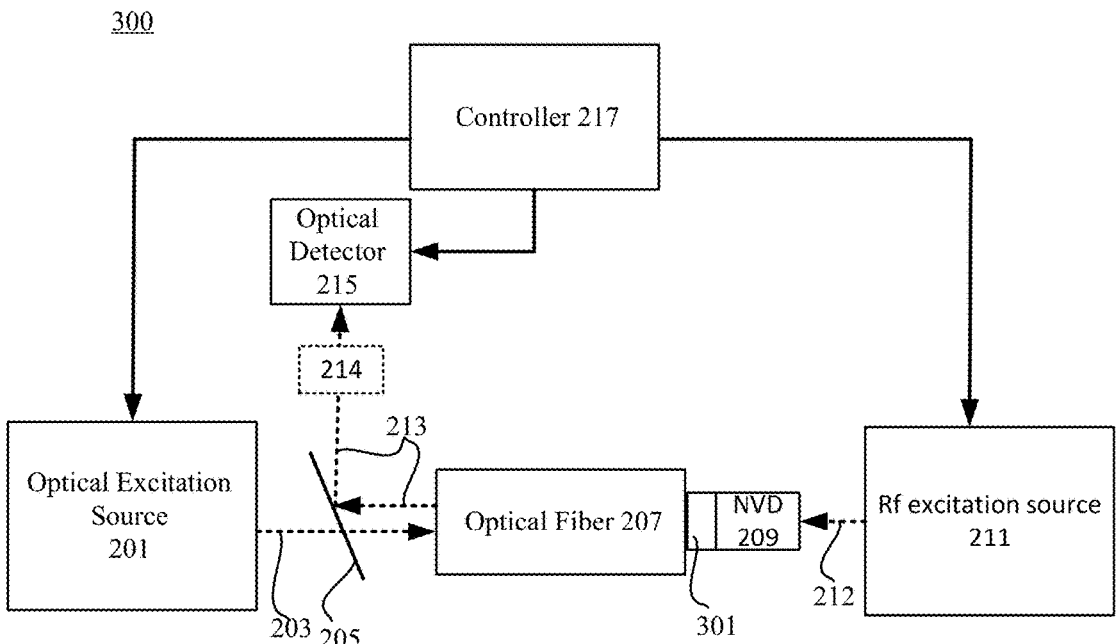
FIG. 3A is a block diagram of one example of an NV diamond sensor system consistent with the present disclosure.
Figure 3B:
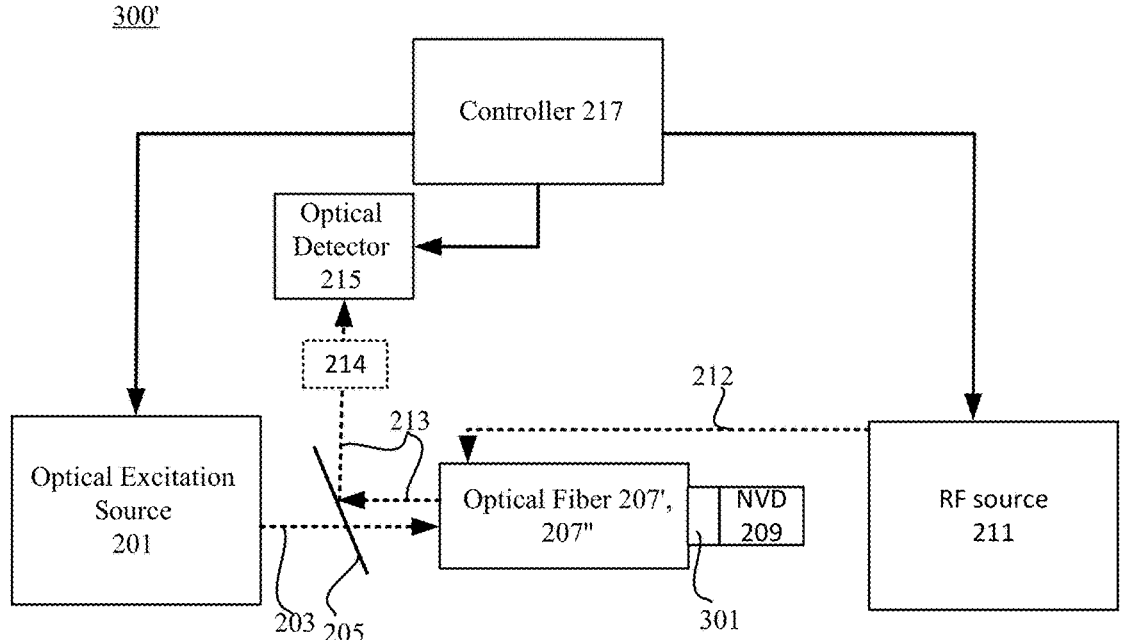
FIG. 3B is another block diagram of one example of an NV diamond sensor system consistent with the present disclosure.

To address such issues, in embodiments the systems of the present disclosure include an optical fiber that includes a first end and a second end. The first end of the optical fiber is optically coupled to an optical excitation source. The second end of the optical fiber is coupled to an NV diamond sensor with an optical matching material that is optically matched to the core of the optical fiber and the NV diamond sensor. FIGS. 3A and 3B depicts examples of such systems. Systems 300, 300' include many of the same components of system 200. As such components are configured and function in the same manner as corresponding components of system 200, such components are not described again in the interest of brevity. Unlike system 200, systems 300 and 300' include an optical matching material 301 that couples one end of optical fiber 207', 207" to NV diamond sensor 209. In addition, system 300' differs from systems 200 and 300 in that RF source 211 is configured to introduce RF energy 212 into an optical fiber (e.g., optical fiber 207, 207', 207" as discussed later) for conveyance to NV diamond sensor 209, as described later.

Figure 4A:
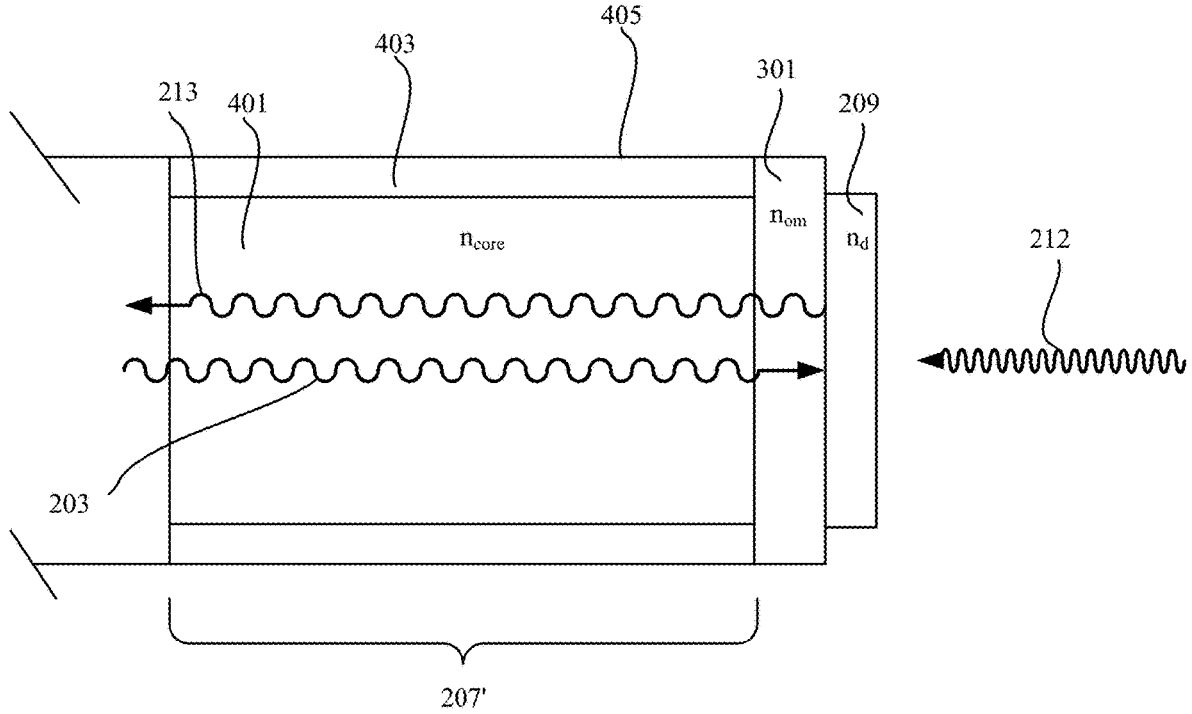
FIG. 4A is an example cross sectional diagram of one end of a fiber optic cable coupled to a NV diamond sensor consistent with the present disclosure.

In general, optical matching material 301 is configured such that its refractive index is between that if the optical fiber core and the NV diamond excitation (e.g., green) light 203 and signal (e.g., red) light 213. More specifically and as shown in FIG. 4A, optical fiber 207 may be a clad optical fiber that includes a core 401, a jacket 405 surrounding the core 401, and a cladding 403 between the core 401 and the jacket 405. Optical matching material 301 may be disposed at one end of optical fiber 207, such that it covers an end face of at least core 401, and in embodiments covers an end face of core 401 and cladding 403. NV diamond sensor 209 is coupled to optical matching material 301, e.g., opposite to the end face of core 401 as shown. Core 401 has an optical index Ncore, optical matching material 301 has an optical index Nom, and NV diamond sensor 209 has an optical index Nd at the wavelength(s) of excitation light 203 and signal light 213. In the case where Nd>Ncore, the index of the optical matching material, Nom, should be selected from the range Ncore+0.2(Nd–Ncore)<Nom<Ncore+0.8(Nd–Ncore), preferentially from the range Ncore+0.3(Nd–Ncore)

<Nom<Ncore+0.7(Nd–Ncore), and most preferentially from the range Ncore+0.4(Nd–Ncore)<Nom<Ncore+0.6 (Nd–Ncore).

The transmission across an interface is given in formula 2.

$$T = 4\frac{n_1 n_2}{[n_1 + n_2]^2} \qquad (2)$$

If we use 1.0 and 1.5 as the two refractive indices, which gives a transmission of T=0.96.

Figure 4B:
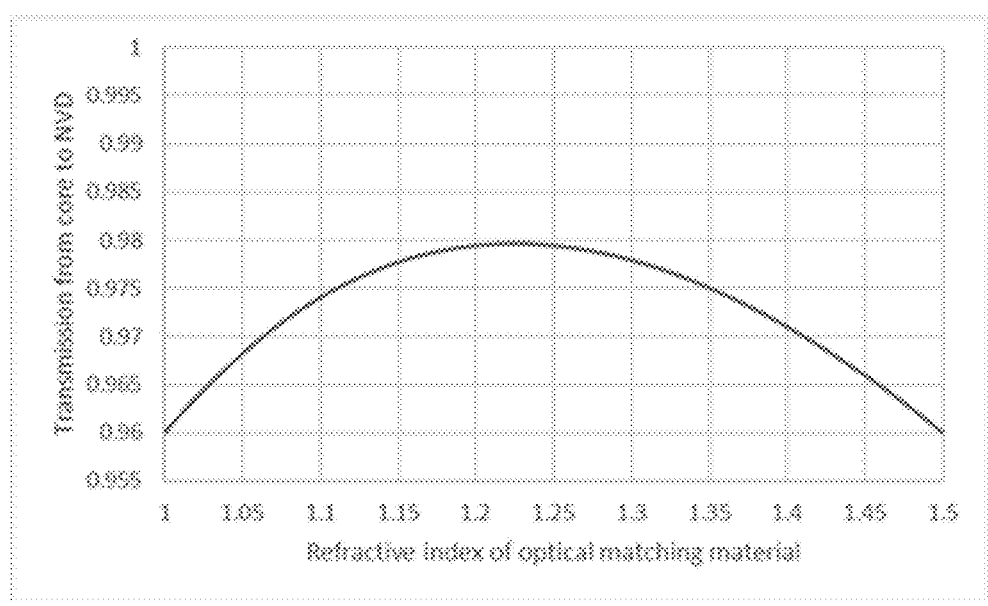
FIG. 4B is an example of the total transmission as a function of the index of the optical matching material consistent with the present disclosure.

If we insert an optical matching material between the core and NVD, we now have transmission across the core-optical matching interface, and transmission across the optical matching-NVD interface. The total transmission is the product of the two individual transmissions. FIG. 4B shows the total transmission as a function of the index of the optical matching material. The range from 1.1 to 1.4 is the range specified, 1.15 to 1.35 is preferred, and 1.2 to 1.3 is most preferred.

In the case where Nd–Ncore>0.1, it may be preferred to use several layers of optical matching material, layered such that Ncore<Nom1<Nom2< . . . <NomN<Nd, where OM1 is the optical matching layer closest to the core and OMN is the optical matching material closest to the diamond. In the case where Nd<Ncore, the index of the optical matching material, Nom, should be selected from the range Nd+0.2(Ncore–Nd) <Nom<Nde+0.8(Ncore–d), preferentially from the range Nd+0.3(Ncore–Nd)<Nom<Nde+0.7(Ncore–d), and most preferentially from the range Nd+0.4(Ncore–Nd) <Nom<Nde+0.6(Ncore–d).

Optical matching material 301 may be any suitable material with refractive index between the core 401 of optical fiber 207 and to NV diamond sensor 209, and which is transparent to excitation (e.g., green) light 203 and signal (e.g., red) light 213. As used herein, the term "transparent" means that a material transmits greater than 95% (e.g., >99%) of light of an indicated wavelength or wavelength range. Non-limiting examples of suitable materials that can be used as or in optical matching material 301 include an optical adhesive, such as but not limited to Loctite 3526 (n=1.51), Norland NOA61 (n=1.56) and Norland NOA170 (n=1.74), combinations thereof, and the like. Notably, use of optical matching material 301 between the end of optical fiber 207 (or 207', 207" as discussed below) and NV diamond sensor 209 can reduce the amount of reflection and/or scattering of excitation light 203 and signal light 213 (relative to systems in which NV diamond is coupled directly to the end of optical fiber 207). This can improve the efficiency of excitation from the $^3A_2$ ground state to the $^3E$ excited state, as well as increase the amount of signal light 213 that reaches optical detector 215.

In embodiments, systems 300 is used to measure the magnetic field of a sample with an optical fiber 207 that is configured in the manner shown in FIG. 4A. In such embodiments, optical excitation source 201 is optically coupled to a first end of optical fiber 207. Optical excitation source 201 emits excitation (e.g., green) light 203, which is conveyed through core 401 of optical fiber 207 and optical matching material 301 to impinge on NV diamond sensor 209 as shown in FIG. 4A. The excitation light 203 stimulates electrons in the NV diamond sensor 209 from the ground state to the excited state. As such electrons relax from the excited state to the ground state, the NV diamond sensor 209 emits signal (e.g., red) light 213. The signal light 213 is conveyed by core 401 of optical fiber 207, through optional optical filter 214, and to optical detector 215 where it is measured.

Figure 5:
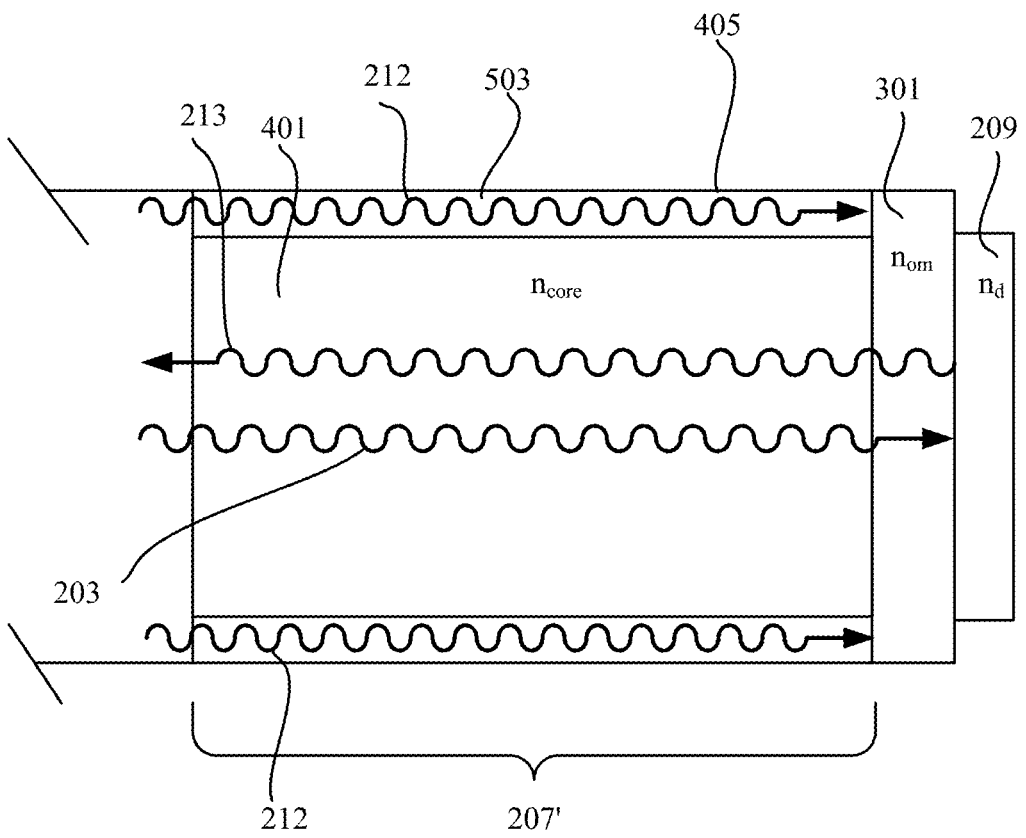
FIG. 5 is another example cross sectional diagram of one end of a fiber optic cable coupled to a NV diamond sensor consistent with the present disclosure.

In other embodiments, system 300' is used to measure the magnetic field of a sample with an optical fiber 207' that is configured in the manner shown in FIG. 5. In such embodiments, RF source 211 is configured to provide RF energy 212 to optical fiber 207', 207" for conveyance to NV diamond sensor 209. To that end and as shown in FIG. 5, optical fiber 207' may include a core 401, a cladding 503, and a jacket 405. Core 401 and jacket 405 are configured and function in the same manner as described above in connection with FIG. 4A, and so are not described again. Unlike optical fiber 207, optical fiber 207' includes a cladding 503 that is configured to convey RF energy 212 to NV diamond sensor 209. In that that regard, cladding 503 may be any suitable cladding that can transmit RF energy produced by RF source 211. In embodiments, cladding 503 is or includes a waveguide or other structure that can transmit RF energy 212 produced by RF source 211 to NV diamond sensor 209. As may be appreciated, configuring optical fiber 207' and system 300' in that manner may eliminate the need to position RF source 211 (which can be quite bulky) in close proximity to the sample being measured, opening avenues to the measurement of smaller samples.

Figure 6:
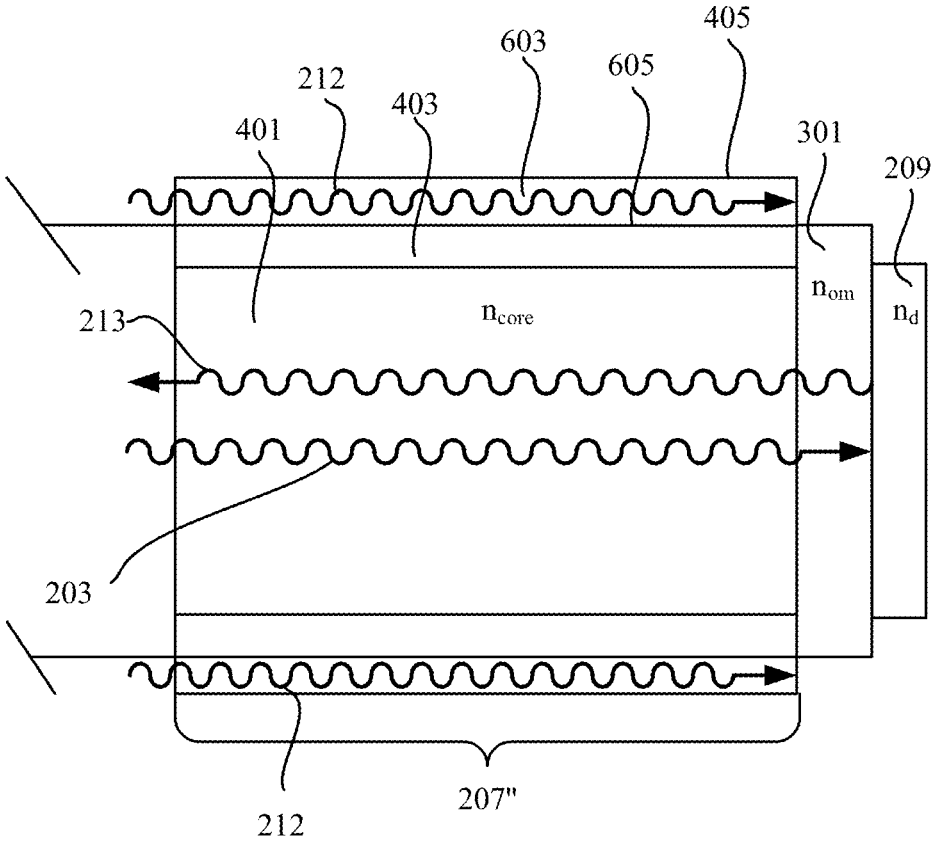
FIG. 6 is another example cross sectional diagram of one end of a fiber optic cable coupled to a NV diamond sensor consistent with the present disclosure.

In additional embodiments, system 300' is used to measure the magnetic field of a sample with an optical fiber 207" that is configured in the manner shown in FIG. 6. In such embodiments, RF source 211 is configured to provide RF energy 212 to optical fiber 207" for conveyance to NV diamond sensor 209. In such embodiments, optical fiber 207" may include a core 401, a cladding 403, and a jacket 405, which are configured and function in the same manner described above in connection with FIGS. 4 and 5. In addition, optical fiber 207" includes an RF transmitting medium 603, which may be positioned between cladding 403 and jacket 405. An interface 605 may be present between cladding 403 and RF transmitting medium 603. Like cladding 503, RF transmitting medium 603 may be formed from any suitable materials and configured in any suitable manner, provided it can transmit RF energy produced by RF source 211. In embodiments, RF transmitting medium 603 is or includes a waveguide or other structure that can transmit RF energy 212 produced by RF source 211 to NV diamond sensor 209. Like optical fiber 207', optical fiber 207" can also eliminate the need to position RF source 211 (which can be quite bulky) in close proximity to the sample being measured, opening avenues to the measurement of smaller samples.

Another aspect of the present disclosure relates to technologies for improving the sensitivity of a NV diamond sensor system, and systems using the same. As noted above with reference to FIG. 1, the NV center includes a triplet of electrons, each of which occupy one of three ground state spin states, $m_s=0$, and $m_s=+/-1$. More specifically, the triplet splits according to the following Hamiltonian 3:

$$H = D_{gs}m_s^2 + \gamma_e B_s m_s \qquad (3)$$

In which $D_{gs}$ is the ground state zero field splitting and equals 2.87 GHZ, $\gamma_e$ is the gyromagnetic ratio (28 GHz/T), $B_z$ is the component of the external magnetic field along the NV axis, and $S_z$ is the spin state (−1, 0, +1). In the excited state the triplet splits according to a similar Hamiltonian except that in the excited state zero field splitting Des is 1.42 GHz.

As also explained above, the ground state triplet can be excited with green (e.g., 515 or 532 nm) light to above the excited state, after which the electrons may decay non-radiatively to the excited $m_s=0$ and $m_s=+/-1$ states. The electron in the excited $m_s=0$ state decays radiatively to the ground state with an emission at $\lambda 1$, which is typically 637 nm. The electrons in the excited $m_s=+/-1$ states preferentially decay to intermediate A,E energy states with a non-optical transition. However, some of the excited $m_s=+/-1$ electrons decay to the ground state in a spin conserving manner with a radiative emission at a wavelength $\lambda 2$. Typically, $\lambda 1$ and $\lambda 2$ differ by a frequency of approximately 1.4 GHz With the foregoing in mind, application of an RF energy to the NV diamond can alter the population of electrons in the ground $m_s=0$ and $+/-1$ states due to the absorption of the microwave energy. More specifically, application of RF energy to the NV diamond can increase the population of the $m_s=+/-1$ states and decrease the population of the $m_s=0$ state. As all of the excited $m_s=0$ electrons decay radiatively (at $\lambda 1$) but only some of the excited $m_s=+/-1$ electrons decay radiatively (at $\lambda 2$), application of an RF field generally results in a reduction in the intensity of the emission produced when the NV diamond is excited in response to excitation light at $\lambda 0$. The difference in signal can be quantitatively measured, with the difference between the minimum of the measured signal from 2.87 GHz corresponding to the strength of an external magnetic field as determined by the Hamiltonian above.

Conventional measurement techniques using NV diamond measure the emission resulting from the decay of the excited $m_s=0$ and $m_s=+/-1$ states to the ground state together. That is, conventional measurements using NV diamond look at the ratio of the total number of emitted photons (i.e., the total amount of signal light) produced in the zero field and RF field state following excitation of the NV diamond with green light. This is because such measurements use an optical detector that does not (or cannot) distinguish the photons at $\lambda 1$ emitted from the decay from the excited $m_s=0$ states from the photons at $\lambda 2$ emitted from the decay from the excited $m_s=+/-1$ states. With that foregoing in mind, the inventors have recognized that that the wavelength $\lambda 1$ of the photons emitted from the decay from the excited $m_s=0$ states differ from the wavelength $\lambda 2$ of the photons emitted from the decay from the excited $m_s=+/-1$ states as discussed above. More specifically, the inventors determined that $\lambda 2$ differs from $\lambda 1$ by at least about $+/-0.002$ nm, a margin that is wide enough to enable highly sensitive optical detectors (e.g., high sensitivity spectrometers such as those produced and sold by LightMachinery) to distinguish between photons with $\lambda 1$ and photons with $\lambda 2$.

With that in mind, in embodiments the systems and methods described herein utilize an optical detector (e.g., a high resolution spectrometer) that can distinguish between the photons with $\lambda 1$ that are emitted due to decay from the excited $m_s=0$ state and photons with $\lambda 2$ that are emitted from due to decay from the excited $m_s=+/-1$ states. As may be appreciated, distinguishing between the photons with $\lambda 1$ and photons with $\lambda 2$ can enable a controller to attribute the measured photons to one or more of the $m_s=0$, $m_s=1$, and $m_s=-1$ states. The controller can then utilize the ratio of emitted photons from the $m_s=1$ and $m_s=-1$ in the zero field and RF (microwave) applied state to determine the component of an external magnetic field that is aligned with such states with a greater degree of sensitivity than if the instrument utilized the ratio of the total number of emitted photons (Ne) in the zero field and applied RF (microwave) field states. For example, and as noted above with the simplified model, in the zero field state Ne=0.86, whereas in the applied RF (microwave) field state Ne=0.72, a 16% reduction in signal. In the systems and methods of embodiments of the present disclosure, the measurement instead utilizes only the photons ($NE_{+/-1}$) attributable to the decay from the excited $m_s=+/-1$ states to perform the measurement. In those embodiments and applying the simplified model, $NE_{+/-1}=$ $(0.1*0.3)+(0.1*0.3)=0.06$ in the zero field state, whereas $NE_{+/-1}=(0.2*0.3)+(0.2*0.3)=0.12$ when an RF (microwave) field is applied. Thus, by distinguishing and utilizing only the photons ($NE_{+/-1}$) attributable to the decay from the excited $m_s=+/-1$ states to perform the measurement, a 100% increase in signal (0.06 in the zero field versus 0.12 in the applied RF field) is achieved.

Figure 7C:
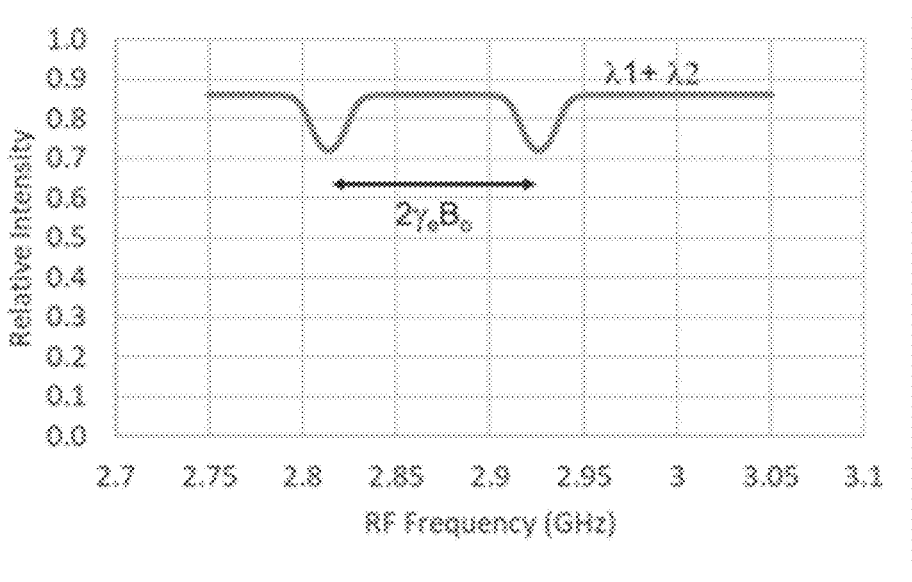
FIG. 7C is an example of the results achieved when the system is operated in the continuous wave mode consistent with the present disclosure.
Figure 7D:
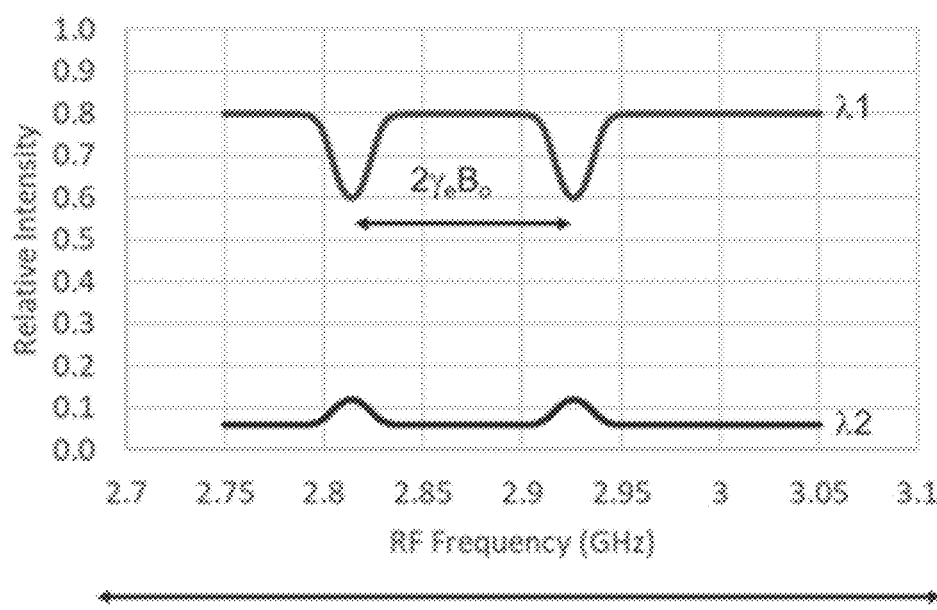
FIG. 7D is an example of the results achieved where λ1 and λ2 are collected separately consistent with the present disclosure.

In the tables of FIGS. 7A and 7B, the populations are the same as for the example of FIGS. 2B and 2C. If, however, the system is operated in the continuous wave mode, as discussed previously, by collecting both the λ1 and λ2 emissions, the results achieved are shown in FIG. 7C, where the lowest signal is 84% of the original intensity. If the system is operated where λ1 and λ2 are collected separately, then the result is shown in FIG. 7D. In FIG. 7D, there is a larger relative decrease in the λ1 intensity, while the λ2 intensity is doubled.

The above technique can be applied using any suitable NV diamond measurement system, such as systems 300, 300' discussed above. The technique may also be performed with other NV measurement systems, such as but not limited to system 800 shown in FIG. 8. System 800 includes many of the same components as system 300, 300, which for brevity are not described again. System 800 differs from systems 300, 300' in that it does not utilize an optical fiber to transport excitation light 203, signal light 213, and optionally RF energy 212 from RF source 211.

Figure 10:
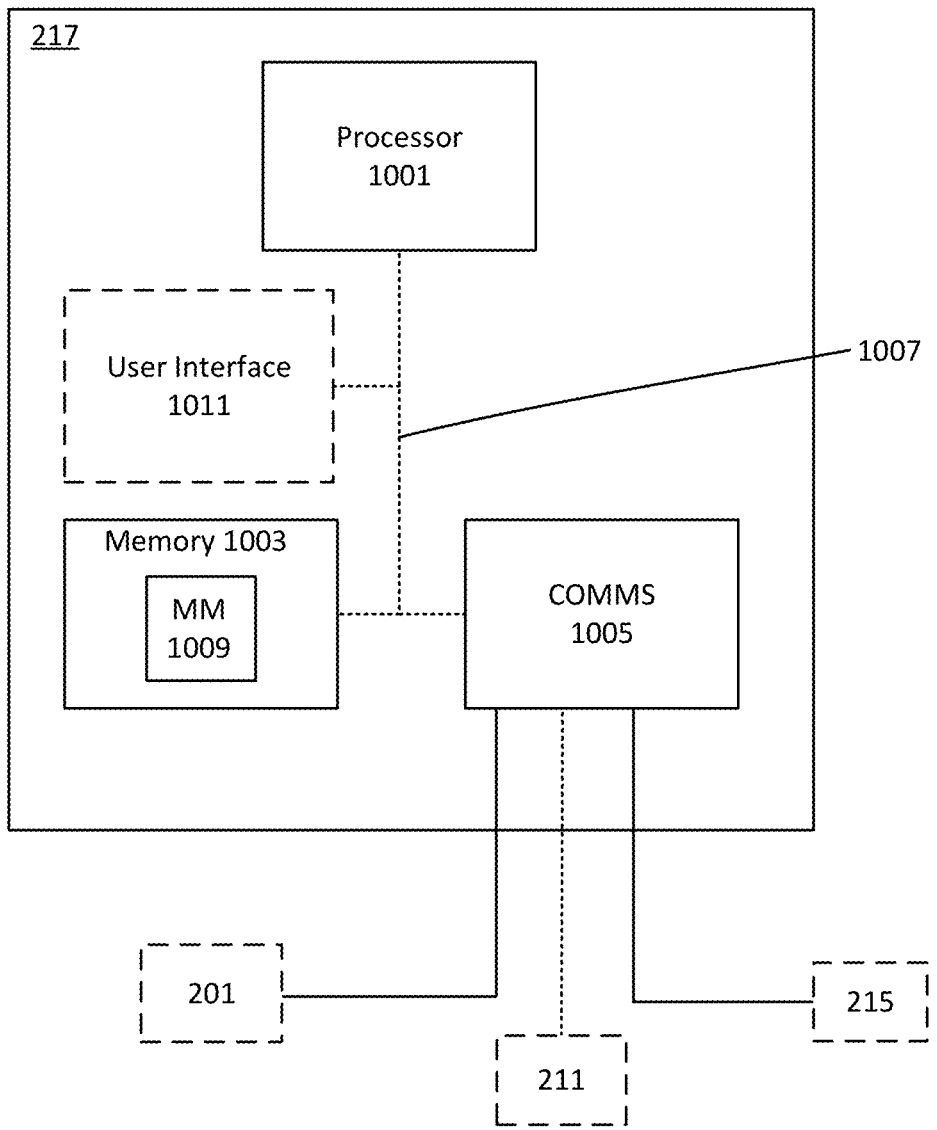
FIG. 10 is a block diagram of one example of a controller for a NV diamond sensor system consistent with the present disclosure.

Reference is now made to FIG. 10, which is a block diagram illustrating one example of a controller 217 that may be used in accordance with the present disclosure. As shown, controller 217 includes a processor 1001, memory 1003, communications circuitry (COMMS) 1005, and an optional user interface 1011. Such components may be communicatively coupled to one another in any suitable manner, such as via a bus 1007.

Processor 1001 may be any suitable general-purpose processor, field programmable gate array (FPGA) or application specific integrated circuit. Without limitation, in embodiments processor 1001 is one or more single or multicore processors produced by INTEL® corporation, APPLE® corporation, AMD® corporation, SAMSUNG® corporation, NVIDIA® corporation, Advanced RISC Machines (ARM®) corporation, combinations thereof, or the like. Alternatively, or additionally, processor 1001 is or includes an FPGA or FPGA system on a chip that includes both a digital logic component and processing component. While FIG. 10 depicts the use of a single processor 1001, multiple (2, 3, 4, etc.) processors can be used.

Memory 1003 may be any suitable type of computer readable memory. Examples of memory types that may be used as memory 1003 include but are not limited to: programmable memory, non-volatile memory, read only memory, electronically programmable memory, random access memory, flash memory (which may include, for example NAND or NOR type memory structures), magnetic disk memory, optical disk memory, phase change memory, memristor memory technology, spin torque transfer memory, combinations thereof, and the like. Additionally, or alternatively, memory 1003 may include other and/or later-developed types of computer-readable memory.

COMMS 1005 may include hardware (i.e., circuitry), software, or a combination of hardware and software that is configured to allow controller 217 to transmit and receive messages via wired and/or wireless communication to/from one or more devices, such as but not limited to optical excitation source 201, RF source 211, and optical detector 215. Communication between COMMS 1005 and those or other components may occur, for example, via a wired or wireless connection using one or more currently known or future developed communication standards. COMMS 1005 may include hardware to support such communication, e.g., one or more transponders, antennas, Bluetooth® chips, personal area network chips, near field communication chips, wired and/or wireless network interface circuitry, combinations thereof, and the like.

Optional user interface 1011, when used, is configured to provide a mechanism for a user to interact with and configure controller 217 and/or one or more components thereof. Any suitable user interface may be used as user interface 1011. For example, user interface 1011 may be or include a mechanical user interface, a graphical user interface, or a combination thereof.

Controller 217 further includes a measurement module (MM) 1009. In this specific context, the term "module" refers to software, firmware, circuitry, and/or combinations thereof that is/are configured to perform or cause the performance of one or more operations consistent with the present disclosure. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in controller 217, e.g., within memory 1003 (as shown in FIG. 10) or other computer readable storage. In embodiments, MM 1009 is in the form of logic that is implemented at least in part in hardware to perform measurement operations consistent with the present disclosure. For example, MM 1009 may be in the form of computer readable instructions which when executed by processor 1001 cause controller 217 to perform measurement operations consistent with the present disclosure, such as but not limited to all or a subset of the operations of the method of FIG. 11 described herein.

Another aspect of the present disclosure relates to systems and methods that can enhance the sensitivity of a NV diamond sensor system by enhancing the contrast between the photo emissions produced by the decay from the excited state $m_s=0$ and $m_s=+/-1$ states to their corresponding ground states. The techniques described herein are particularly suitable for use in pulsed optically detected magnetic resonance (ODMR) measurements using NV diamond, but they can be used with other NV diamond measurement techniques as well. For the sake of example, the techniques described herein will be described in the context of the systems of FIG. 8, but such techniques can be employed with other systems as well, including but not limited the systems of FIGS. 2, 3A, and 3B.

In pulsed ODMR, the $NV^-$ spin state is optically initialized the $m_s=0$. Subsequently and during an interrogation time T, a near resonant microwave pulse is applied with a duration equal to the interrogation time I, wherein the Rabi frequency $R=\pi/I$, and the population of the $m_s=0$ and $+/-1$ states is read out optically. A change in external magnetic field alters the spin resonance relative to the microwave frequency, resulting in an incomplete microwave pulse and a change in the population transferred from the $m_s$=0 to the $m_s$=+/−1 state prior to the optical readout. As described in Barry et al., "Sensitivity Optimization for NV-Diamond Magnetometry," Rev. Mod. Phys 92, 015004, Mar. 31, 2020, the sensitivity of the pulsed ODMR technique can be given by formula 4 below:

$$\eta_{pulsed} \approx \frac{8}{3\sqrt{3}} \frac{\hbar}{g_e \mu_B} \frac{1}{C_{pulsed}\sqrt{N}} \frac{\sqrt{t_1 + T_2^+ + t_n}}{T_2^+} \qquad (4)$$

In which $\eta_{pulsed}$ is the sensitivity, $g_e$ is the NV-center's electronic g-factor, $\mu_B$ is the Bohr magneton, $C_{pulsed}$ is the pulsed ODMR contrast, $t_1$ is the initialization time, $t_R$ is the readout time, and T2 is the interrogation time. As can be seen, the sensitivity of the pulsed ODMR technique is dependent on the contrast $C_{pulsed}$.

As noted above electrons in the excited $m_s$=0 and $m_s$=/−1 state in NV diamond centers can decay to their corresponding ground state with an emission of a photon. When NV diamond is used as a sensor in high sensitivity magnetic detection such as ODMR, the $m_s$=0 and $m_s$=+/−states need to be distinguished. While such states can be distinguished based on their wavelength (e.g., as discussed above), such techniques may rely on high sensitivity instrumentation as the difference in the emitted wavelength may be quite small.

With that in mind, the inventors have recognized that the decay of emissions from a NV diamond center under an applied RF field (i.e., the NV1 state) takes longer than the decay of emissions from an NV diamond center in the absence of an applied RF field (i.e., the NV0) stater. Without wishing to be bound by theory, it is believed that the longer decay length from the $m_s$=+/−1 state is due to the electrons entering a singlet state. This phenomenon is demonstrated in FIG. 9, which is a plot of number of photons versus time for an emission 901 of photons from the NV0 state (i.e., in the absence of an applied RF field) and emissions from the NV− state (i.e., in the presence of an applied RF field). An NV diamond center may be prepared in the NV0 state by optical pumping the NV diamond with excitation light 203 at a time TO in the absence of an applied RF field. In contrast, an NV diamond center may be prepared in the NV− state by applying an RF pulse to the NV diamond and then optically pumping it with excitation light 203 at time TO. As shown in FIG. 9, a relatively large emission 901 from the NV0 state is observed immediately following optical pumping with excitation light 203, after which the emission decays to a steady state value (at time T2) in which some populations are trapped in the metastable state. In the NV− state (i.e., following application of an RF pulse) following optical pumping a large emission 903 is observed, which rapidly declines due to transitions of the electrons to a metastable state that preferentially decays to the NV0 state. The contrast $C_{pulsed}$ between such emissions is the difference between the emissions from the NV0 and NV− states at a particular time. As shown in FIG. 9, $C_{pulsed}$ is maximized at a time T1 following optical excitation of the NV diamond sensor 209 with excitation light 203. In embodiments, T1 is within a range of greater than 0 to 400 nanoseconds (ns; e.g., from greater than or equal to about 10 to 200 ns, from about 10 to about 100 ns, or even from about 10 to about 50 ns) following optical pumping of the NV diamond with excitation light 203. Thus, at time T1, the contrast $C_{pulsed}$ is at a relatively high level (compared to other points in the signal).

With the foregoing in mind, in embodiments the systems described herein utilize an optical detector and a controller 217 that are configured to perform magnetometry measurements, e.g., with pulsed ODMR. In such embodiments the controller and optical detector are configured to measure the signal light 213 produced by NV diamond sensor 209 during the pulsed ODMR measurement at a time T1 following pumping with excitation light, both before and after application of an RF pulse. By measuring the signal light 213 produced by NV diamond sensor 209 at that time, the $C_{pulsed}$ may be increased (relative to a measurement outside of T1), resulting in a corresponding increase in measurement sensitivity.

In embodiments, the systems described herein (e.g., 200, 300, 300' 700) include an optical detector 215 that includes or is in the form of a gated sensor, such as a gated photodiode, a gated camera, or the like. The gated sensor may be configured to measure signal light 213 emitted at a time T1 following application of excitation light 203, both before and after application of RF energy 212 and provide a data signal to controller 217. Controller 217 (or more specifically, measurement module 1009) may be configured to analyze the data signal and determine a contrast $C_{pulsed}$ 905 therefrom. Controller 217 (or MM 1009) may accomplish that, for example, by determining the emissions data versus time, and analyzing the emissions data from the NV0 and NV− states at time T1, where T1 is within the ranges noted above. Alternatively, controller 217 (or MM 1009) may be configured to determine a point at which the difference (contrast) between the emissions from the NV0 and NV− states is maximized, and to determine the contrast $C_{pulsed}$ at that point. Boxcar averaging or other signal processing techniques may be applied to facilitate the determination of the point at which $C_{pulsed}$ is at a maximum. The controller 217 (or MM 1009) may then analyze the external magnetic field of a sample under consideration using the determined contrast and ODMR as known in the art, e.g., with application of formula II above.

In another embodiment, the systems described herein (200, 300, 300', 700) include an optical detector 215 that is configured to perform time correlated single photon counting (TCSPC). In such instances, the systems described herein may perform an ODMR measurement on a sample by optically pumping NV diamond sensor 209 with excitation light 203 while NV diamond sensor 209 is in the NV0 or NV− state, i.e., before or after application of an applied RF field by RF source 211. Following application of the excitation light 203, optical detector 215 may perform single photon counting analysis on the signal light emitted by NV diamond sensor and output a detection signal to controller 217. Controller 217 (or more specifically, MM 1009) may fit the emissions data to the time and determine the contrast $C_{pulsed}$ between the curves for the NV0 and NV− states as discussed above. Boxcar averaging or other signal processing techniques may be applied to facilitate the determination of the point at which $C_{pulsed}$ is at a maximum. The controller 217 (or MM 1009) may then analyze the external magnetic field of a sample under consideration using the determined contrast and ODMR as known in the art, e.g., with application of formula II above.

Figure 9A:
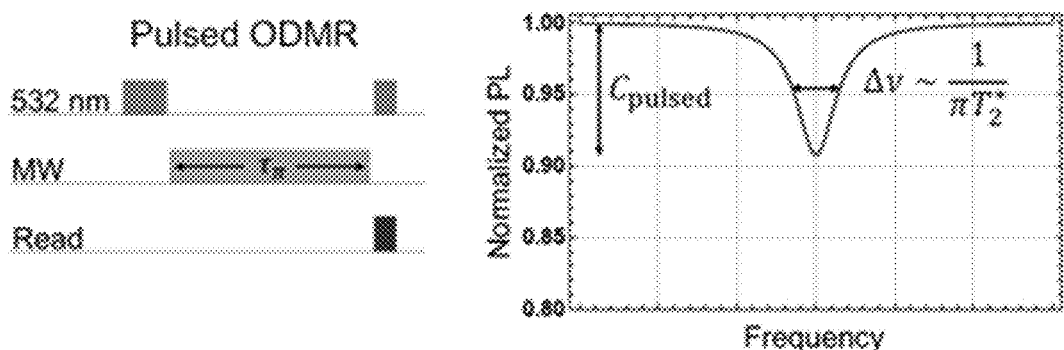
FIG. 9A is an example curve demonstrating enhanced contrast consistent with the present disclosure.

The way the system would be used experimentally is to perform the above measurement for multiple RF frequencies, to generate a curve such as shown in FIG. 9A. The contrast (difference in signal between RF off and RF on) can be enhanced as described above, by using a spectrometer to separate the light emitted from the two transitions.

Figure 9B:
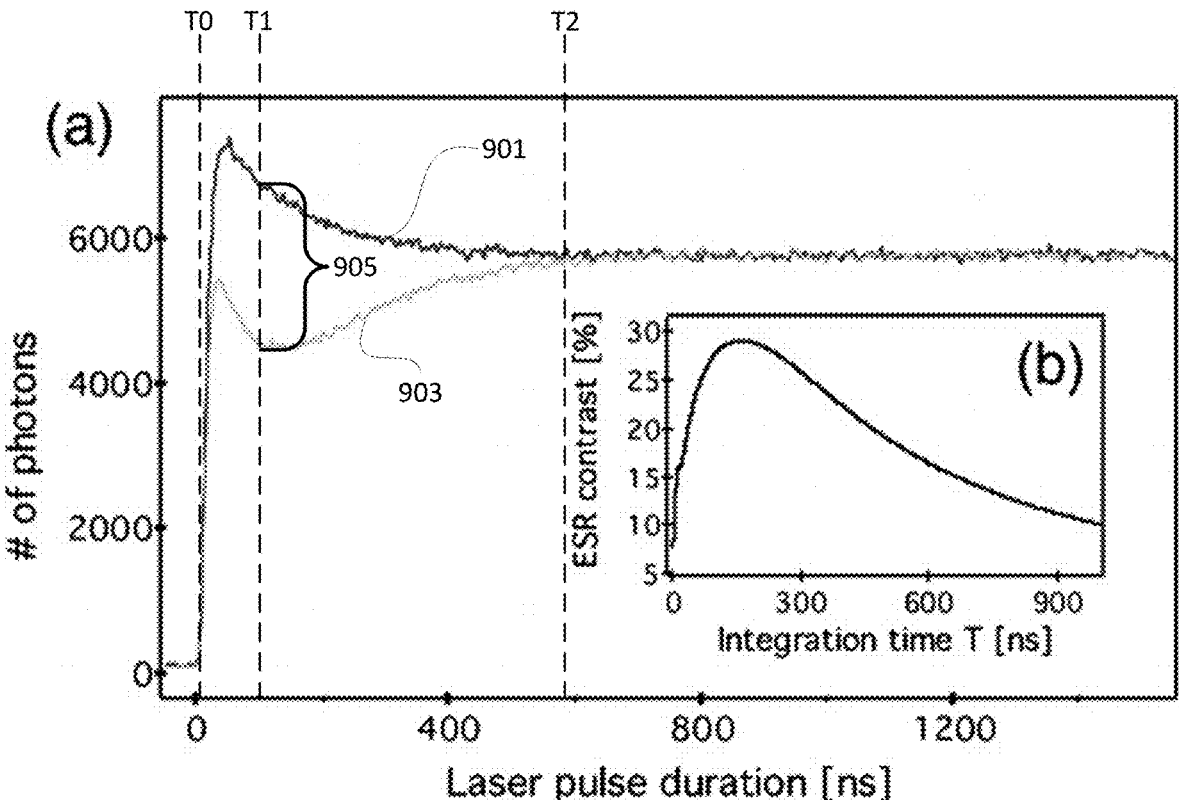
FIG. 9B is a plot of number of emitted photons versus time.

The second way to enhance contrast is shown in FIG. 9B, which is to measure the emitted light at a specific time after the start of the laser pulse to read out the signal. Because of the gated read, it is possible to measure the optical intensity at a specific time after the start of the read. FIG. 9B shows the difference in signal between the RF off state in the top curve (large emission 901) and the RF on state in the bottom curve (large emission 903) is maximized at time T1. So operationally, the system would be used as in the other tests. The system would be prepared by applying the 532 nm light, then applying the RF for time ($\tau_{\pi}$), then applying the 532 light for measurement. But in this case, the light would only be collected for a small time interval around T1. This can provide a factor of 1.5× to 2× increase in contrast.

The timing for the ODMR experiment is shown in the FIG. 9A. The 532 nm light is first applied to initialize the system, next the RF is applied for a specific time ($t_p$), then the 532 light is applied to read out the state of the system by the total light emitted.

Figure 11:
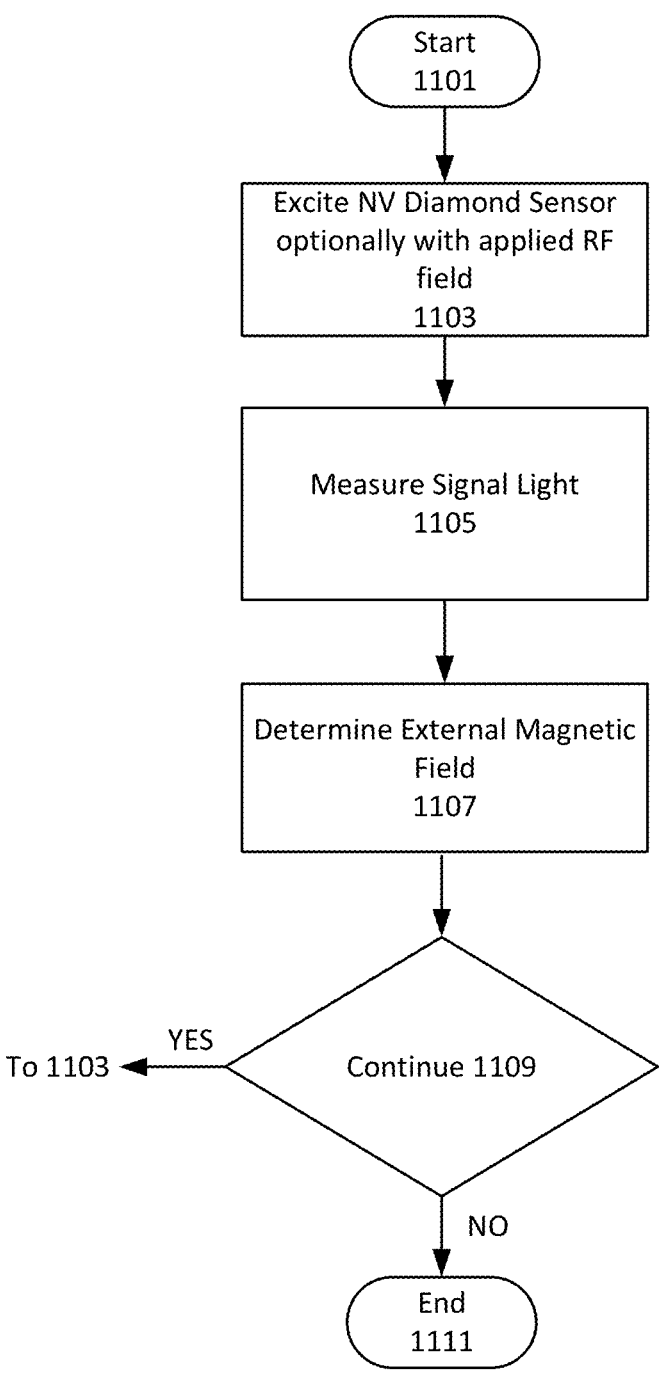
FIG. 11 is a flow chart of example operations of one example of a method of measuring a component of a magnetic field, consistent with the present disclosure.

FIG. 11 is a flow chart of example operations of one example of a method of measuring a magnetic field with an NV diamond sensor consistent with the present disclosure. As shown, method 1100 begins at block 1101. The method proceeds to block 1103, pursuant to which an NV diamond sensor (placed in proximity to a sample) is excited with (green) excitation light, either in the absence or presence of an RF (microwave) field. The method may then proceed to block 1105, pursuant to which the resulting signal light produced by the NV diamond sensor may then be measured, e.g., by an optical detector such as a high sensitivity spectrometer, gated photodiode, gated camera, time correlated single photon counter, etc., as described above. The method may then proceed to block 1107, pursuant to which all or a component of an external magnetic field (e.g., attributable to the sample) may be determined. For example, pursuant to block 1107 a controller may process the signal provided by the optical detector to determine which photons it the signal light are attributable to decay of the excited $m_s$=+/−1 states when the NV diamond sensor is used in the presence of an applied RF (microwave) field. The controller may then use that component of the signal light to determine a portion of the magnetic field produced by the sample, e.g., which is aligned with the $m_s$=+/−1 states. The method may then proceed to block 1109, pursuant to which a determination may be made as to whether the measurement is to continue. If so the method loops back to block 1103, but if not the method proceeds to block 1111 and ends.

FIG. 12A is a table of subcomponents that may be used in the design of a compact magnetometer using an NV diamond, along with two examples of devices to reduce the size of the magnetometer consistent with the present disclosure. Currently, magnetometers with high-sensitivity also are also very large and heavy. Magnetometers that exist in an IC package are very small but lack the stability and room temperature operation quality of NV diamond. As used herein, room temperature may be defined as in the range of 15 degrees Celsius (° C.) to 30° C., for example, 20° C. A high-sensitivity, low-volume magnetometer may be integrated into any hand-held electronic, space and air vehicles, satellites, and may be packed tightly enough to enable imaging applications through 2D magnetometer arrays-a capability that does not currently exist using NV diamond.

NV diamond offers high-sensitivity vector magnetometry capability at room temperature. Many groups have demonstrated NV diamond-based magnetometry using benchtop setups with little effort to minimize the volume of their final system. This disclosure identifies ways to greatly reduce the volume of NV diamond magnetometers to the level of mass production and micro-nano integration.

The NV diamond miniaturization consists of well-established subcomponents which induce the phenomenon needed to apply the device as a magnetometer. The disclosed device can be miniaturized by minimizing the gaps between each subcomponent, which may include bringing them into contact with each other, in a number of configurations depending on the application. The subcomponents may include, but are not limited to, a photonic sensor, a microwave source, the NV diamond, and a light source. Optionally, filter and focus optics can be added before and/or after the NV diamond to optimize magnetometer performance.

Disclosed herein is the use of NV diamond to produce a compact NV diamond magnetometer. The use of the NV diamond as the magnetometry medium allows for the miniaturization of the magnetometer because NV diamond is cheaper and easier to fabricate than other magnetometry mediums and is stable at room temperature.

The table of FIG. 12A includes a generic magnetometer 1210 and two examples of miniaturized magnetometers, a macro-scale magnetometer 1220 and a chip-scale magnetometer 1230. The generic magnetometer 1210 is a listing of the subcomponents of a typical magnetometer. The generic magnetometer 1210 includes a photonic sensor 1211, a first filter and focus optics 1212, a microwave source 1213, the NV diamond 1214, a second filter and focus optics 1215, and a light source 1216. As mentioned above, the filter and focus optics are optional, and the magnetometer may include either the first filter and focus optics 1212, the second filter and focus optics 1215, or both the first filter and focus optics 1212 and the second filter and focus optics 1215.

The macro-scale magnetometer 1220 is a first level miniaturization of the generic magnetometer 1210 and may be defined as having a volume greater than 1 cubic centimeter to less than 1000 cubic centimeters, for example, 100 cubic centimeters. The macro-scale magnetometer 1220 may include a charge-coupled device (CCD) camera 1221 as the photonic sensor 1211. The CCD camera 1221 is a light-sensitive integrated circuit that captures images by converting photons to electrons. The first filter and focus optics 1212 in the macro-scale magnetometer 1220 may be a long-pass filter and tube lens 1222. A long-pass filter is a filter designed to transmit wavelengths within a given wavelength range, while a tube lens is a lens that is used to focus or collimate the light.

The microwave source 1213 in the macro-scale magnetometer 1220 may be an RF antenna 1223. The second filter and focus optics 1215 in the macro-scale magnetometer 1220 may be a laser line filter and diffuser plate 1225. A laser line filter is a precision optical filter with an extremely narrow passband centered on a standard laser wavelength, and a diffuser plate is a type of material used to scatter or diffuse light. The light source 1216 in the macro-scale magnetometer 1220 may be a green LED 1226. The macro-scale magnetometer 1220 also includes the NV diamond 1224.

The chip-scale magnetometer 1230 is a second level miniaturization of the generic magnetometer 1210 and may be defined as having a volume of less than 1 cubic centimeter, for example, 100 cubic micrometers. The chip-scale magnetometer 1230 may include a silicon photodiode 1231 as the photonic sensor 1211. The silicon photodiode 1231 is a semiconductor device used for the detection of light in ultra-violet, visible and infrared spectral regions. The first filter and focus optics 1212 in the chip-scale magnetometer 1230 may be a silicon dioxide etched micro lens 1232. A micro lens is a small lens, generally with a diameter less than a millimeter (mm) and often as small as 10 micrometers (μm), and a silicon dioxide etched micro lens is a micro lens formed by etching glass with silicon dioxide.

The microwave source 1213 in the chip-scale magnetometer 1230 may be a nanofabricated RF antenna 1233. The second filter and focus optics 1215 in the chip-scale magnetometer 1230 may also be a silicon dioxide etched micro lens 1235. The light source 1216 in the chip-scale magnetometer 1230 may be a gallium nitride (GaN) laser diode 1236. The chip-scale magnetometer 1230 also includes the NV diamond 1234.

FIG. 12B is an example of configurations of the compact magnetometer of FIG. 12A to further minimize device volume and overcome geometric design restrictions consistent with the present disclosure. FIG. 12B includes example configuration-1 1240, example configuration-2 1242, example configuration-3 1243, and example configuration-4 1244. The numbers in the boxes for each example configuration indicates the generic part from generic magnetometer 1210 corresponding to the box in the example configuration. So, a box "1" represents the photonic sensor 1211, a box "2" represents the first filter and focus optics 1212, a box "3" represents the microwave source 1213, a box "4" represents the NV diamond 1214, a box "5" represents the second filter and focus optics 1215, and a box "6" represents the light source 1216.

The example configurations in FIG. 12B are intended to provide a non-exhaustive list of arrangements using the corresponding subcomponents of generic magnetometer 1210 which still enable the disclosed system with the added benefit of decreasing the size of the integrated device along at least one axis. In other words, instead of just stacking the subcomponents into a single linear construction, the example configurations illustrate that the subcomponents may occupy regions in the other two dimensions.

Although many other configurations are possible, any configuration is subject to the following limitations and guidelines. First, the NV diamond 1214 (boxes "4") must be adjacent to the microwave source 1213 (boxes "3"). So, in the examples of FIG. 12A, for the macro-scale magnetometer 1220 the NV diamond 1224 must be adjacent to the RF antenna 1223, and for the chip-scale magnetometer 1230 the NV diamond 1234 must be adjacent to the nanofabricated RF antenna 1233.

A second limitation is that the energy emitted through the light source 1216 (boxes "6") must be transmitted through (as in configurations 1240 and 1243), and/or reflected (as in configurations 1242 and 1244) by the NV diamond 1214 (boxes "4") and finally reach the photonic sensor 1211 (boxes "1"). It should be noted that subcomponents "2," i.e., the first filter and focus optics 1212, and "5," i.e., the second filter and focus optics 1215, are optional but improve performance of the NV diamond device.

According to one aspect of the disclosure there is thus provided a system for measuring a magnetic field of a sample, the system including: an optical fiber comprising a first end and a second end, the optical fiber having a core; and a nitrogen vacancy (NV) diamond sensor; where the first end of the optical fiber is configured to receive excitation light from an optical excitation source; and the NV diamond sensor is coupled to the second end of the optical fiber with an optical matching material, the optical matching material configured to optically match the NV diamond sensor to the core of the optical fiber.

According to another aspect of the disclosure there is thus provided a system for measuring a magnetic field of a sample, the system including: a nitrogen vacancy (NV) diamond sensor; an optical excitation source optically coupled to the NV diamond sensor; an RF source configured to produce RF field at or proximate to the NV diamond sensor; an optical detector configured to receive signal light produced by the NV diamond sensor in response to application of excitation light to the NV diamond sensor; and a controller configured to perform measurement operations. The measurement operations including: cause the optical detector to: receive the signal light produced by the NV diamond sensor in response to the excitation light produced by the optical excitation source; determine a first number of photons P1 with a first wavelength $\lambda 2$ in said signal light that correspond to photons emitted from a first excited state $m_s = +/-1$ state to a first ground $m_s = +/-1$ state in said NV diamond sensor in an absence of an RF field produced by said RF source; determine a second number of photons P2 with the first wavelength $\lambda 2$ in said signal light that correspond to the photons emitted from the first excited state $m_s = +/-1$ state to the first ground $m_s = +/-1$ state in said NV diamond sensor following application of the RF field produced by said RF source; and determine a component of an external magnetic field proximate said NV diamond sensor using a ratio of the first number of the photons P1 and the second number of photons P2.

According to yet another aspect of the disclosure there is thus provided a system for measuring a magnetic field of a sample, the system including: a nitrogen vacancy (NV) diamond sensor; an optical excitation source optically coupled to NV diamond sensor; an RF source configured to produce RF field at or proximate to the NV diamond sensor; an optical detector configured to receive signal light produced by the NV diamond sensor in response to application of excitation light to the NV diamond sensor; and a controller configured to perform measurement operations. The measurement operations including: cause the optical detector to: receive the signal light produced by the NV diamond sensor in response to the excitation light produced by the optical excitation source; measure the signal light during a pulsed optically detected magnetic resonance (ODMR) measurement; and determine a component of an external magnetic field proximate said NV diamond sensor based on the ODMR measurement.

According to yet another aspect of the disclosure there is thus provided a magnetometer, the magnetometer including: a photonic sensor; a microwave source; an NV diamond; and a light source, where the NV diamond is a magnetometry medium; and the magnetometer is stable at room temperature.

As used herein the term "about" when used in conjunction with a value or a range, means+/–5% of the indicated value or +/–5% of the endpoints of the indicated range.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed is:

1. A system for measuring a magnetic field of a sample, the system comprising:

an optical fiber comprising a first end and a second end, the optical fiber having a core; and

19 a nitrogen vacancy (NV) diamond sensor;
wherein:
    the first end of the optical fiber is configured to receive
        excitation light from an optical excitation source;
        and
    the NV diamond sensor is coupled to the second end of
        the optical fiber with an optical matching material,
        the optical matching material configured to optically
        match the NV diamond sensor to the core of the
        optical fiber;
    wherein:
        the core of the optical fiber has an optical index
            Ncore, the NV diamond sensor has an optical
            index Nd, and the optical matching material has an
            optical index Nom;
        responsive to the Nd is greater than the Ncore, select
            the optical matching material with the Nom in a
            range of Ncore+0.2 (Nd−Ncore)<Nom<Ncore+
            0.8 (Nd−Ncore); and
        responsive to the Nd is less than the Ncore, select the
            optical matching material with the Nom in the
            range of Nd+0.2 (Ncore−Nd)<Nom<Nd+0.8
            (Ncore−Nd).
    2. A system for measuring a magnetic field of a sample,
the system comprising:
    a nitrogen vacancy (NV) diamond sensor;
    an optical excitation source optically coupled to the NV
        diamond sensor;
    wherein:
        the optical excitation source is optically coupled to
            the NV diamond sensor with an optical matching
            material; and
        the optical matching material has a first optical index
            that differs from a second optical index of the NV
            diamond sensor by less than five percent;
    an RF source configured to produce RF field at or proxi-
        mate to the NV diamond sensor;
    an optical detector configured to receive signal light
        produced by the NV diamond sensor in response to
        application of excitation light to the NV diamond
        sensor; and
    a controller configured to perform measurement opera-
        tions, the measurement operations comprising:
    cause the optical detector to:
        receive the signal light produced by the NV diamond
            sensor in response to the excitation light produced by
            the optical excitation source;
        determine a first number of photons P1 with a first
            wavelength λ2 in the signal light that correspond to
            photons emitted from a first excited state $m_s$=+/−1
            state to a first ground $m_s$=+/−1 state in the NV
            diamond sensor in an absence of an RF field pro-
            duced by the RF source;
        determine a second number of photons P2 with the first
            wavelength λ2 in the signal light that correspond to
            the photons emitted from the first excited state
            $m_s$=+/−1 state to the first ground $m_s$=+/−1 state in the
            NV diamond sensor following application of the RF
            field produced by the RF source; and
        determine a component of an external magnetic field
            proximate the NV diamond sensor using a ratio of
            the first number of the photons P1 and the second
            number of photons P2.
    3. A system for measuring a magnetic field of a sample,
the system comprising:
    a nitrogen vacancy (NV) diamond sensor;

20 an optical excitation source optically coupled to NV
        diamond sensor,
    wherein:
        the optical excitation source is optically coupled to
            the NV diamond sensor with an optical matching
            material; and
        the optical matching material has a first optical index
            that differs from a second optical index of the NV
            diamond sensor by less than five percent;
    an RF source configured to produce RF field at or proxi-
        mate to the NV diamond sensor;
    an optical detector configured to receive signal light
        produced by the NV diamond sensor in response to
        application of excitation light to the NV diamond
        sensor; and
    a controller configured to perform measurement opera-
        tions, the measurement operations comprising:
    cause the optical detector to:
        receive the signal light produced by the NV diamond
            sensor in response to the excitation light produced by
            the optical excitation source;
        measure the signal light during a pulsed optically
            detected magnetic resonance (ODMR) measure-
            ment; and
    determine a component of an external magnetic field
        proximate the NV diamond sensor based on the ODMR
        measurement.
    4. A magnetometer comprising:
    a photonic sensor;
    a microwave source;
    an NV diamond; and
    a light source, wherein:
        the NV diamond is a magnetometry medium;
        the magnetometer is stable at room temperature;
        the light source is coupled to the NV diamond with an
            optical matching material; and
        the optical matching material has a first optical index
            that differs from a second optical index of the NV
            diamond by less than five percent.
    5. The system of claim 1, wherein the optical matching
material is an optical adhesive.
    6. The system of claim 1, wherein the optical fiber is
further configured to receive a radio frequency (RF) signal
at the first end of the optical fiber or between the first end and
the second end of the optical fiber and convey the RF signal
to the second end of the optical fiber.
    7. The system of claim 2, wherein the controller is further
configured to determine a third number of photons with a
second wavelength λ1 in the signal light that correspond to
the photons emitted from a second excited state $m_s$=+/−0
state to a second ground $m_s$=+/−0 state in the NV diamond
sensor in a presence and the absence of the RF field
produced by the RF source,
    wherein λ2 differs from λ1 by less than or equal to about
        0.010 nm.
    8. The magnetometer of claim 4, wherein the photonic
sensor is selected from the group consisting of a charge-
coupled device (CCD) camera and a silicon photodiode.
    9. The magnetometer of claim 4, wherein the microwave
source is selected from the group consisting of a radio
frequency (RF) antenna and a nanofabricated RF antenna.
    10. The magnetometer of claim 4, wherein the light source
is selected from the group consisting of a green light-
emitting diode (LED) and a gallium nitride (GaN) laser
diode.

11. The magnetometer of claim 4, further comprising at least one of a first filter and focus optics and a second filter and focus optics.

12. The magnetometer of claim 11, wherein the first filter and focus optics is selected from the group consisting of a long-pass filter and tube lens and a silicon dioxide etched micro lens.

13. The magnetometer of claim 11, wherein the second filter and focus optics is selected from the group consisting of a laser line filter and diffuser plate and a silicon dioxide etched micro lens.

14. The system of claim 6, wherein:

the optical fiber further comprises a jacket surrounding the core;

the optical fiber further comprises a cladding between the jacket and the core; and the cladding is configured to convey the RF signal to the second end.

15. The system of claim 6, wherein:

The optical fiber further comprises a jacket surrounding the core;

the optical fiber further comprises a cladding between the jacket and the core; and the optical fiber further comprises a waveguide between the cladding and the jacket, the waveguide configured to convey the RF signal to the second end.

16. The system of claim 7, wherein $\lambda 2$ differs from $\lambda 1$ by less than or equal to about 0.002 nm.

17. The system of claim 15, further comprising:

the optical excitation source optically coupled to the first end of the optical fiber, the optical excitation source to produce the excitation light for application to the NV diamond sensor;

an RF source configured to produce RF energy at or for conveyance to the second end of the optical fiber; and an optical detector configured to receive signal light produced by the NV diamond sensor in response to application of the excitation light to the NV diamond sensor.

* * * * *